US012622284B2

(12) United States Patent
Aoki et al.

(10) Patent No.: US 12,622,284 B2
(45) Date of Patent: May 5, 2026

(54) SOLDER VOLUME FOR FLIP-CHIP BONDING

(71) Applicant: International Business Machines Corporation, Armonk, NY (US)

(72) Inventors: Toyohiro Aoki, Yokohama (JP); Katsuyuki Sakuma, Fishkill, NY (US); Hiroyuki Mori, Yasu (JP); Koki Nakamura, Kawasaki (JP); Takashi Hisada, Hachiouji (JP)

(73) Assignee: International Business Machines Corporation, Armonk, NY (US)

( * ) Notice: Subject to any disclaimer, the term of this patent is extended or adjusted under 35 U.S.C. 154(b) by 469 days.

(21) Appl. No.: 18/111,939

(22) Filed: Feb. 21, 2023

(65) Prior Publication Data

US 2024/0282735 A1 Aug. 22, 2024

(51) Int. Cl.
| | |
|---|---|
| *H10W 70/05* | (2026.01) |
| *H10P 76/20* | (2026.01) |
| *H10W 72/00* | (2026.01) |
| *H10W 72/20* | (2026.01) |
| *H10W 72/90* | (2026.01) |
| *H10W 90/00* | (2026.01) |

(52) U.S. Cl.
CPC ....... *H10W 70/093* (2026.01); *H10W 90/701* (2026.01); *H10P 76/204* (2026.01); *H10W 72/01223* (2026.01); *H10W 72/227* (2026.01); *H10W 72/241* (2026.01); *H10W 72/9415* (2026.01)

(58) Field of Classification Search
CPC ................. H01L 24/13; H01L 21/4853; H01L 23/49816; H01L 24/05; H01L 24/14; H01L 21/0273; H01L 2224/05571; H01L 2224/1131; H01L 2224/1302; H01L 2224/1403; H01L 24/11; H01L 24/16; H01L 24/81
See application file for complete search history.

(56) References Cited

U.S. PATENT DOCUMENTS

| | | | |
|---|---|---|---|
| 6,415,974 | B2 | 7/2002 | Jao |
| 8,496,159 | B2 | 7/2013 | Feger et al. |
| 8,669,137 | B2 | 3/2014 | Nah et al. |
| 9,012,266 | B2 | 4/2015 | Nah et al. |
| 9,312,237 | B2 | 4/2016 | Zheng et al. |

(Continued)

OTHER PUBLICATIONS

Jae-Woong Nah et al., "Mask and mask-less injection molded solder (IMS) technology for fine pitch substrate pumping," IMAPS 2010,Jan. 2010,7 Pages.

(Continued)

*Primary Examiner* — Mohammad A Rahman
(74) *Attorney, Agent, or Firm* — Yuanmin Cai; Scully, Scott, Murphy & Presser, P.C.

(57) ABSTRACT

Methods, systems, and structures relating to flip-chip bonding are described. A processor can determine a plurality of target solder volumes to be deposited on a plurality of pads on a surface of a substrate. The plurality of target solder volumes can be variable among the plurality of pads. The processor can determine different thicknesses of different portions of a layer of resist to be deposited across the surface of the substrate. The different thicknesses can define a plurality of solder resist openings having sizes that comply with the plurality of target solder volumes.

8 Claims, 18 Drawing Sheets

(56)                    References Cited

U.S. PATENT DOCUMENTS

| | | | |
|---|---|---|---|
| 10,741,520 | B2 | 8/2020 | Lin et al. |
| 2002/0017553 | A1 | 2/2002 | Jao |
| 2010/0143656 | A1 | 6/2010 | Zu |
| 2014/0332956 | A1* | 11/2014 | Zheng ............... H01L 23/49816 |
| | | | 257/738 |
| 2016/0181216 | A1 | 6/2016 | Lei et al. |
| 2018/0358323 | A1* | 12/2018 | Audette ............. G01R 31/2898 |
| 2021/0303741 | A1 | 9/2021 | Burns et al. |
| 2022/0059485 | A1 | 2/2022 | Lin et al. |

OTHER PUBLICATIONS

Stefan Decoster et al., "Modeling the Topography of Uneven Substrates Post Spin-Coating",Journal of Vacuum Science & Technology B 36, 03E102 (2018); doi: 10.1116/1.5022166,https://doi.org/10.1116/1.5022166,Published by the American Vacuum Society,Mar. 26, 2018,10 Pages.

* cited by examiner

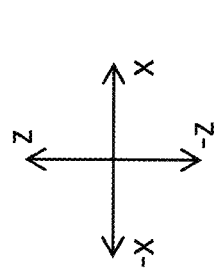
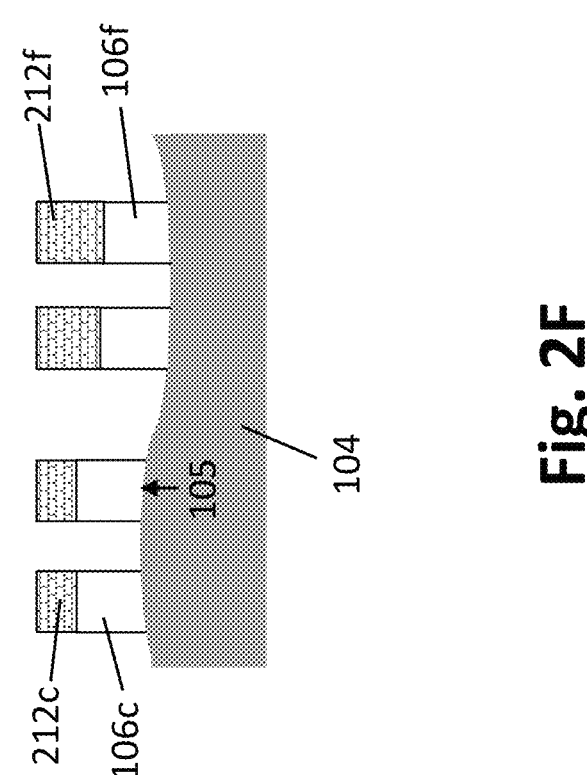
Fig. 2F
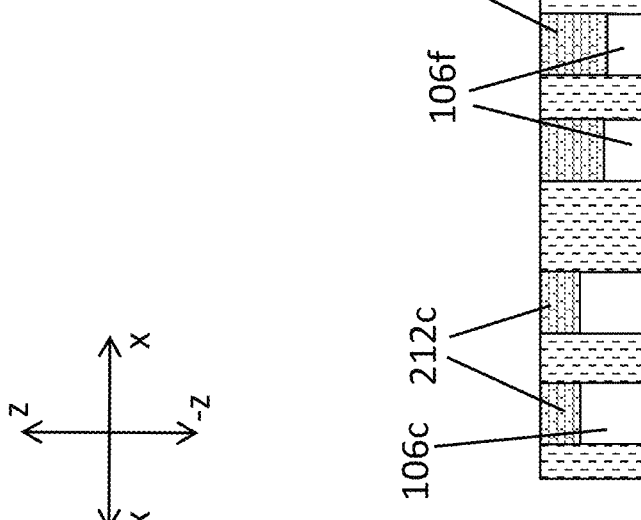
Fig. 2E

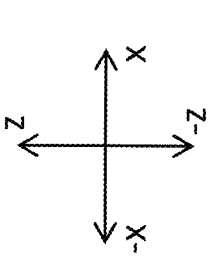
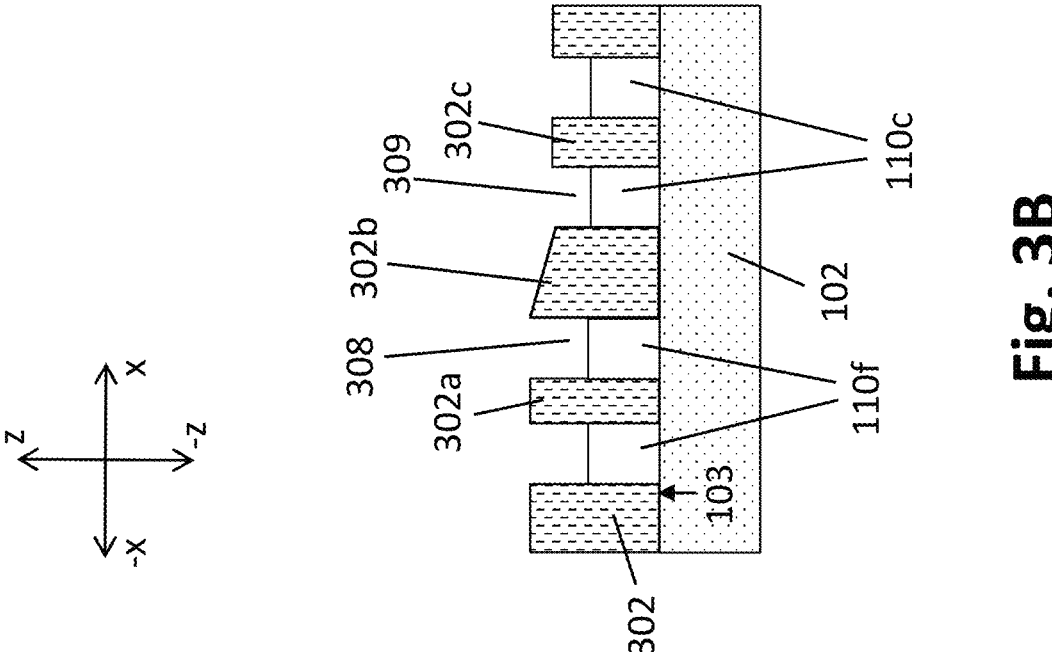
Fig. 3B
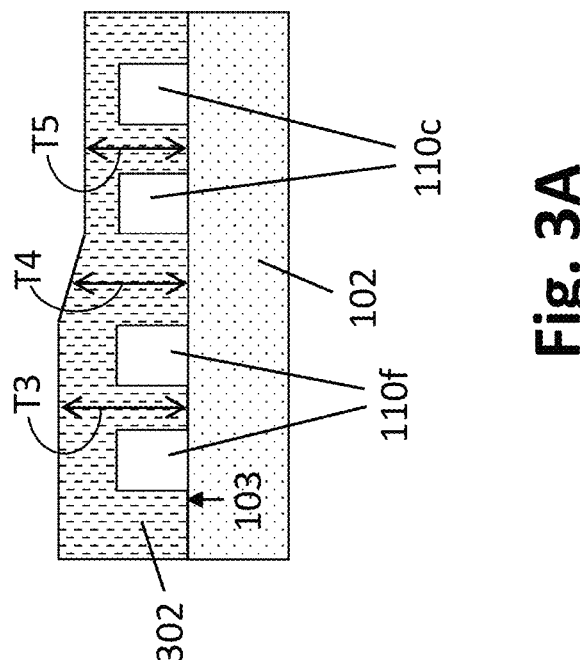
Fig. 3A

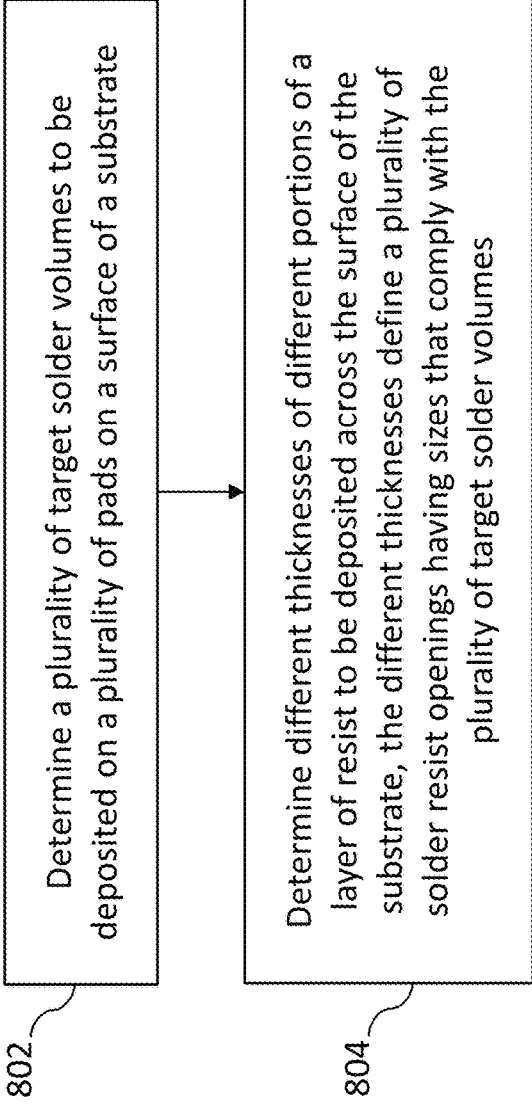

800

802

Determine a plurality of target solder volumes to be deposited on a plurality of pads on a surface of a substrate

804

Determine different thicknesses of different portions of a layer of resist to be deposited across the surface of the substrate, the different thicknesses define a plurality of solder resist openings having sizes that comply with the plurality of target solder volumes

902 — Deposit a layer of resist with variable thickness on a surface of a first substrate 904 — Form a plurality of solder resist openings on the plurality of pads 906 — Fill a plurality of solder resist openings with solder 908 — Remove the layer of resist from the surface of the substrate 910 — Bond a second substrate to the first substrate via a plurality of solder bumps

18

STORAGE SYSTEM

24

NETWORK

16

MEMORY

22

NETWORK ADAPTOR

28

DISPLAY

12

PROCESSOR(S)

30

PROGRAM INSTRUCTIONS

14

20

I/O INTERFACE(S)

26

DEVICE(S)

SOLDER VOLUME FOR FLIP-CHIP BONDING

BACKGROUND

The present application relates to systems and methods for optimizing solder volume for flip-chip bonding based on variable resist thickness.

Structures having high-density interconnections between functional chips such as central processing unit (CPU), graphics processing unit (GPU), high bandwidth memory (HBM), or other types of chips, allow for achieving high-performance computing. Various advanced packaging technologies with fine-pitch interposers and fine-pitch bonding can be used for forming these structures. For example, flip chip bonding can be used for connecting chips to an interposer that provides signal routing among the chips, thus interconnecting the chips to form one package.

SUMMARY

In one embodiment, a method for flip-chip bonding is generally described. The method can include determining, by a processor, a plurality of target solder volumes to be deposited on a plurality of pads on a surface of a substrate. The plurality of target solder volumes is variable among the plurality of pads. The method can further include determining, by the processor, different thicknesses of different portions of a layer of resist to be deposited across the surface of the substrate. The different thicknesses can define a plurality of solder resist openings having sizes that comply with the plurality of target solder volumes.

In one embodiment, a semiconductor package formed by flip-chip bonding is generally described. The semiconductor package can include a first substrate and a second substrate bonded to the first substrate via a plurality of solder joints. The plurality of solder joints can have variable volume. The variable volume can be based on different thicknesses of different portions of a layer of resist being deposited on a surface of the first substrate. The layer of resist can define a plurality of solder resist openings on a plurality of pads of the first substrate. The surface of the first substrate can include at least one imitation pad that is not bonded by the plurality of solder joints. The different thicknesses can be based on the at least one imitation pad.

In one embodiment, a method for flip-chip bonding is generally described. The method can include depositing a layer of resist on a surface of a first substrate. The first substrate can include a plurality of pads, different portions of the layer of resist have different thicknesses, and the different thicknesses can be based on a plurality of predetermined target solder volumes. The method can further include forming a plurality of solder resist openings on the plurality of pads. The sizes of the plurality of solder resist openings can be defined by the different thicknesses of the layer of resist, and the sizes of the plurality of solder resist openings can comply with the plurality of predetermined target solder volumes. The method can further include filling the plurality of solder resist openings with solder. The method can further include removing the layer of resist from the surface of the substrate. A plurality of solder bumps can be formed in response to the removing, where the plurality of solder bumps can have same solder volume as the plurality of predetermined target solder volumes. The method can further include bonding a second substrate to the first substrate via the plurality of solder bumps.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 2E illustrates an example of solder deposited in the solder resist openings shown in FIG. 2C.

FIG. 2F illustrates an example of solder bumps formed by an implementation of optimized solder volume for flip-chip bonding in one embodiment.

FIG. 3A illustrates another example of a layer of resist with variable resist thickness in one embodiment.

FIG. 3B illustrates another example of solder resist openings formed by a layer of resist with variable resist thickness in one embodiment.

FIG. 8 illustrates a flow diagram relating to an implementation of optimized solder volume for flip-chip bonding in one embodiment.

DETAILED DESCRIPTION

In an aspect, an interposer with fine line routing is one of the candidates for the high-density interconnections considering its good electrical performance and simple process flow. Fine-pitch flip chip bonding of large silicon chips directly onto an organic interposer can be challenging. In an aspect, distances between the silicon chip's pads and the organic interposer's pads can vary from location to location due to warpage and the surface topography of the organic interposer (e.g., the top surface of the organic interposer may not be flat). Upon the interconnection, this distance variation can cause variations of solder volume between the pads as well. In an aspect, further distance between pads can risk too little solder volume between the connected pads thus increasing risk of electrical open joints. On the other hand, closer distance between pads can risk too much solder volume thus increasing risk of solder bridging to adjacent joints.

Figure 1:
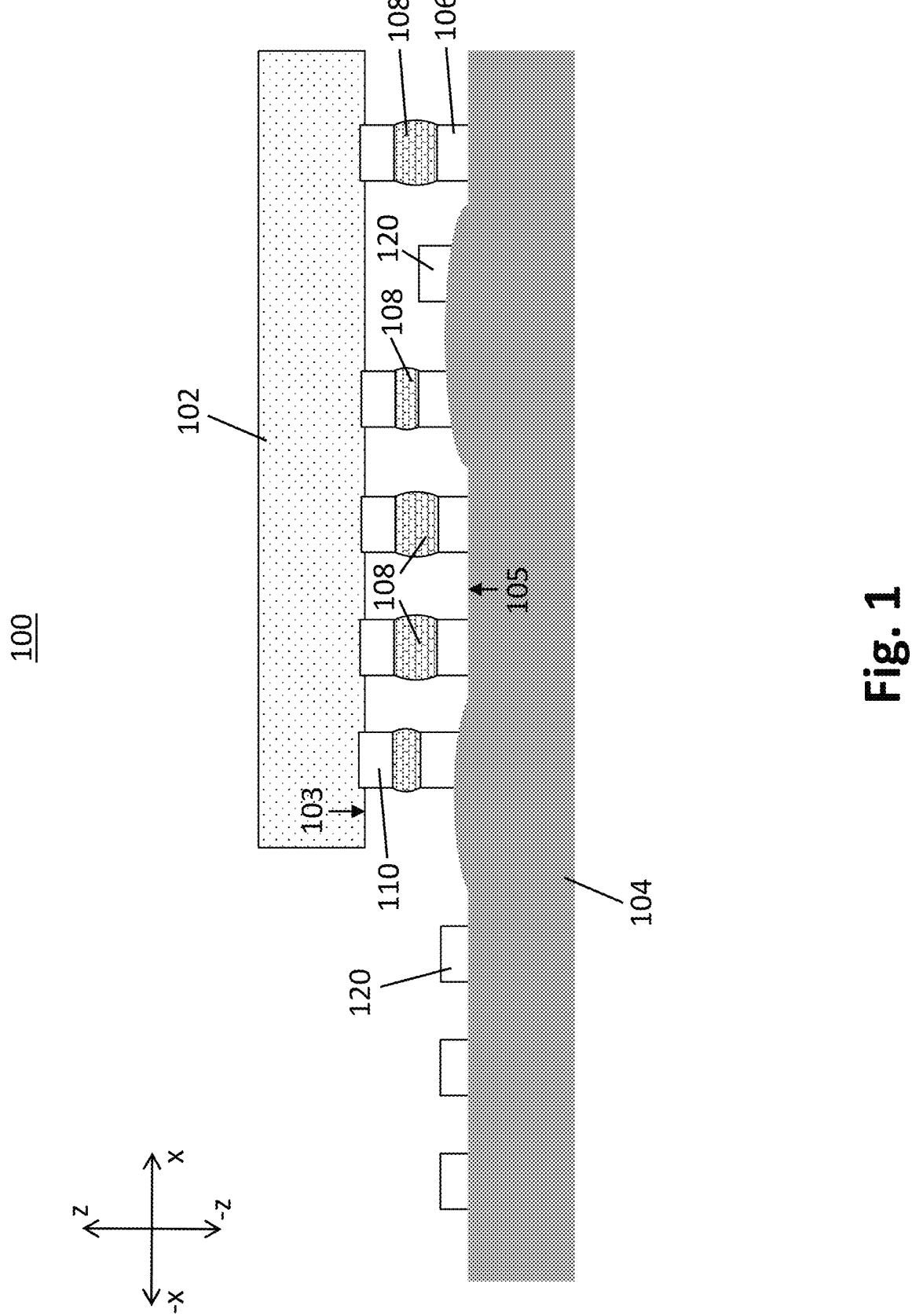
FIG. 1 illustrates an example package that can be formed by implementing optimized solder volume for flip-chip bonding in one embodiment.

FIG. 1 illustrates an example package that can be formed by implementing optimized solder volume for flip-chip bonding in one embodiment. A cross-sectional view of an integrated circuit (IC) package stack 100 ("package 100") is shown in FIG. 1. Package 100 can include a substrate 102 and a substrate 104. Substrate 102 can be, for example, an IC chip including a silicon semiconductor substrate. Substrate 104 can be, for example, a laminate such as an interposer (e.g., organic interposer). Substrate 102 can be flip-chip mounted on substrate 104 using a plurality of solder joints 108. In response to substrate 102 being flip-chip mounted on substrate 104, a top surface 103 of substrate 102 (e.g., towards –z direction) and a top surface 105 of substrate 104 (e.g., towards z direction) can face one another. A plurality of pads 106 can be situated on top surface 105 of substrate 104. The plurality of pads 106, 110 can be, for example, metal pads or metal posts having a pillar shape. A plurality of pads 110 can be situated on top surface 103 of substrate 102.

In an aspect, top surface 105 may not be ideally flat, thus may have undulations. As shown in FIG. 1, top surface 105 can have variable thickness in a lateral direction (e.g., from –x to x direction). The undulations on top surface 105 can cause variations among the peaks of the plurality of pads 106 (e.g., peaks of pads 106 can be at different heights in the z direction). The variations of the peaks can cause distances between pads 110 and pads 106 to vary as well. If a fixed amount of volume is used to connect each one of pads 110 to one of pads 106, the varying distance between the pads 110, 106 can cause solder joints 108 to have undesirable size and/or dimensions. For instance, pads 110, 106 being too far apart can cause solder on pads 110, 106 to not be completely joint, thus increasing risk of electrical open joints. Pads 110, 106 being too close can increase the risk of solder bridging to adjacent joints because of the solder joint can become too large (e.g., protruding to the x and –x directions).

In package 100 shown in FIG. 1, the plurality of solder joints 108 can have different sizes and/or dimensions formed by different volumes of solder. The sizes and/or dimensions of the plurality of solder joints 108 can be predetermined prior to the formation of package 100. In one embodiment, a processor can be configured to determine an individual target solder volume to be deposited on each pad among the plurality of pads 106 and/or the plurality of pads 110. In response to determining the target solder volumes, the processor can determine different thicknesses of different portions of a layer of resist to be deposited across top surface 105 of substrate 104. The different thicknesses can define a plurality of solder resist openings (SROs) having sizes that comply with the plurality of target solder volumes. For example, the SROs defined by the different thicknesses can have sufficient capacity to hold the target solder volumes without electrical open joints and/or solder bridging upon formation of solder joints 108.

In one embodiment, the processor can determine the different thicknesses based on a pad density of top surface 105 and/or top surface 103. The processor can generate and output data indicating adjustments to the plurality of pads 106 and/or the plurality of pads 110 and/or a mask that can be used for depositing the resist. In one embodiment, the processor can generate and output data indicating whether to add imitation pads 120 shown in FIG. 1 at specific locations, or to remove pads among the plurality of pads 106, to adjust pad density of top surface 105, where different pad densities can result in different resist thickness. An apparatus that constructs package 100 can receive the data indicating additions of imitation pads and/or removal of pads, and can perform the indicated additions and/or removal of pads prior to depositing the resist at the different thicknesses for forming package 100.

In another embodiment, the processor can generate and output data indicating adjustments to exposure levels at specific portions of the mask that can be used for forming solder resist openings, where different exposure levels can result in different resist thickness that define different solder resist opening sizes. An apparatus that constructs the mask can receive the data indicating adjustments to exposure levels and construct the mask based on the received data. Another apparatus that constructs package 100 can use the adjusted exposure levels to form solder resist openings by at the different thicknesses for forming package 100.

Figure 2B:
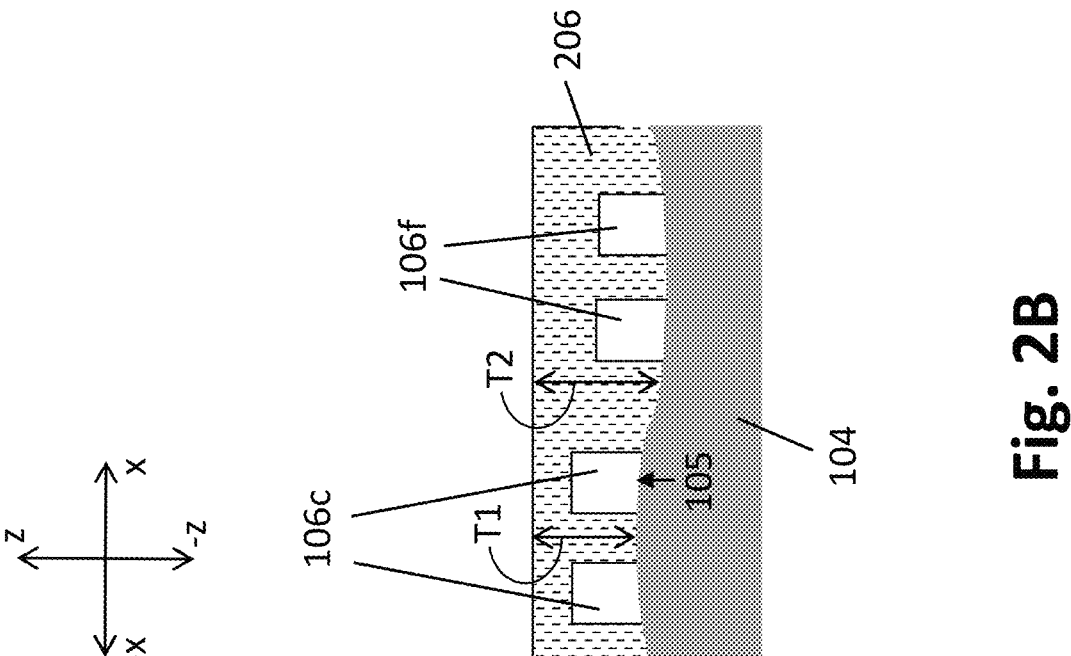
FIG. 2B illustrates an example of a layer of resist with variable thickness in one embodiment.
Figure 2A:
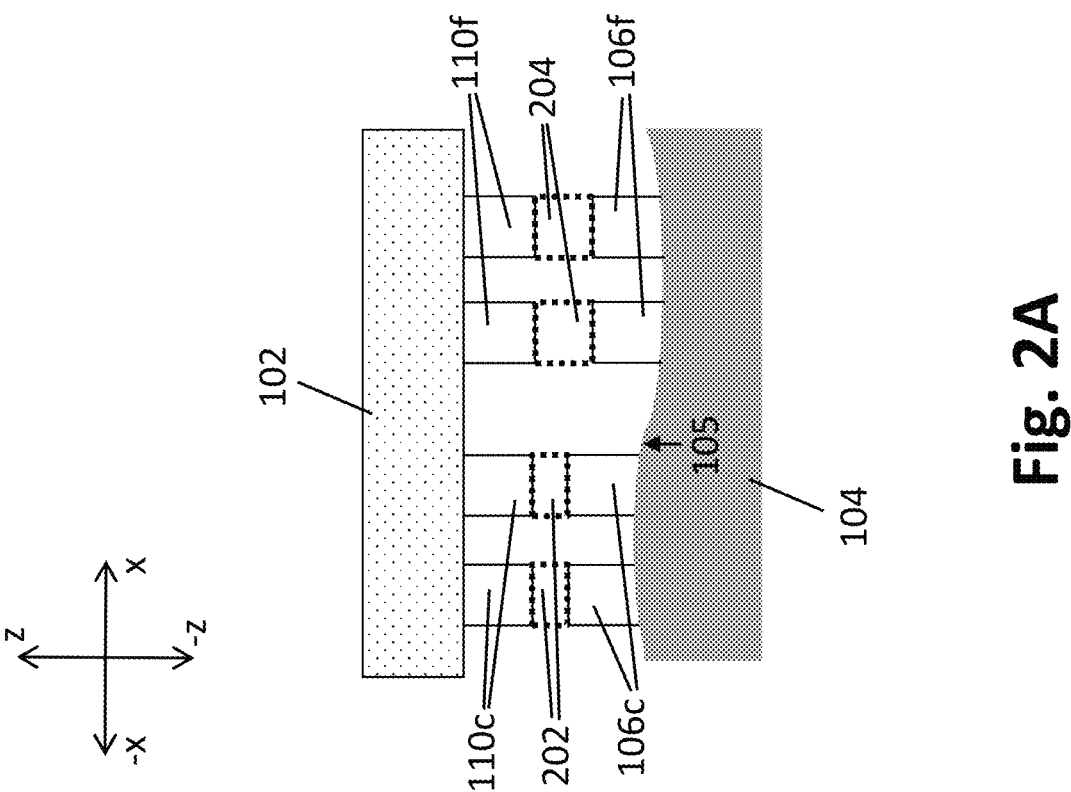
FIG. 2A illustrates an example of target solder volumes for implementing optimized solder volume for flip-chip bonding in one embodiment.

FIG. 2A illustrates an example of target solder volumes for implementing optimized solder volume for flip-chip bonding in one embodiment. In an example shown in FIG. 2, different target solder volumes, such as target solder volumes 202, 204, can be determined prior to forming package 100 of FIG. 1. In the example shown in FIG. 2A, target solder volume 202 can be an amount of solder being deposited between pads 106 and pads 110 that are relatively closer to one another, such as pads 106c, 110c. Target solder volume 204 can be an amount of solder being deposited between pads 106 and pads 110 that are relatively further from one another, such as pads 106f, 110f. In an aspect, if target solder volume 202 is to be deposited between pads 106f, 110f, then a resulting solder joint between pads 106f, 110f may not completely join pads 1106f, 110s and may cause electrical open joints. If target solder volume 204 is to be deposited between pads 106c, 110c, then a resulting solder joint between pads 106c, 110c may be too large and bridge to adjacent solder joints.

FIG. 2B illustrates an example of a layer of resist with variable thickness in one embodiment. In an example shown in FIG. 2B, a layer of resist, labeled as a resist layer 206, can be deposited on top surface 105 of substrate 104. Resist layer 206 can have variable thickness (e.g., vertical distance in z-direction from top surface 105 to peak of resist). In the example shown in FIG. 2B, one portion of resist layer 206 can have a thickness of T1 and another portion of resist layer 206 can have a thickness of T2, where T2 is greater than T1. In one embodiment, the different thicknesses of resist layer 206 across top surface 105 can be predetermined based on target solder volumes, such as target solder volumes 202, 204 in FIG. 2A.

In one embodiment, resist layer 206 can be formed by spin coating, such as dispensing liquid resist on substrate 104 then rotate substrate 104 at a specific rotational speed. In an aspect, resist layer formed by spin coating can have almost uniform thickness. To be described in more detail below, imitation pads can be added to top surface 105 to elevate the resist layer at certain locations, and pads can be removed from top surface 105 to lower the resist layer at certain locations. These adjustment to pads on top surface can cause variation in the thickness of the resist layer.

Figure 2D:
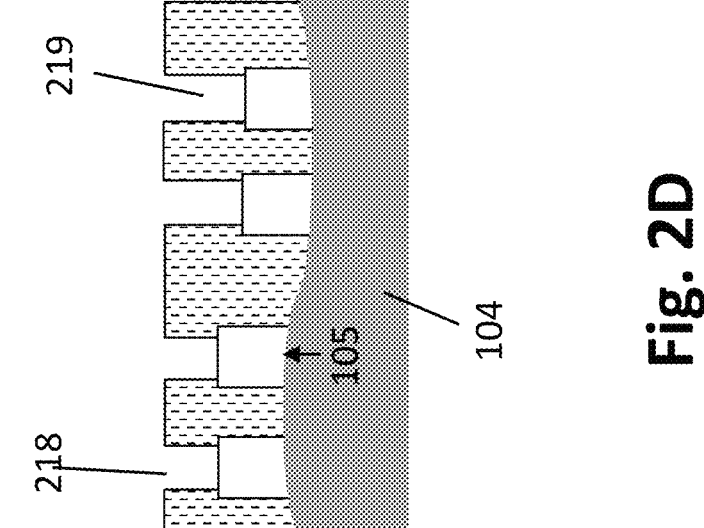
FIG. 2D illustrates another example of solder resist openings formed by a layer of resist with variable resist thickness in one embodiment.
Figure 2C:
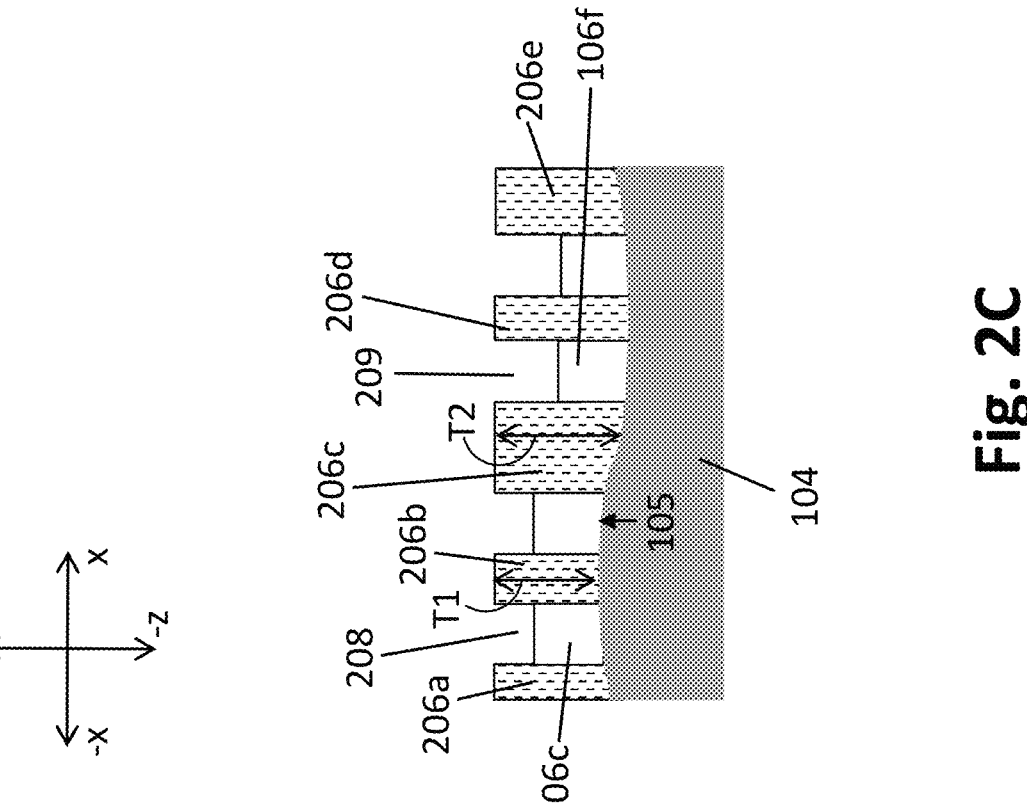
FIG. 2C illustrates an example of solder resist openings formed by a layer of resist with variable resist thickness in one embodiment.

FIG. 2C illustrates an example of solder resist openings formed by a layer of resist with variable resist thickness in one embodiment. In an example shown in FIG. 2C, resist layer 206 in FIG. 2B can be patterned to form a plurality of SROs, such as SROs 208, 209. SRO 208 can be defined or bounded by resists 206a, 206b, and pad 106c. In one embodiment, a mask and ultraviolet (UV) rays can be used for the resist patterning to form SROs 208, 209. The mask can have variable exposure levels such that the amount of resist removed from the top of pads 106c can be less than the amount of resist removed from the top of pads 106f. SRO 209 can be defined or bounded by resists 206d, 206e, and pad 106f. In response to the etching, resists 206a, 206b, 206c, 206d, 206e, can remain on top surface 105. Resist 206b can have the thickness T1 and resist 206c can have the thickness T2. In the embodiment shown in FIG. 2C, a diameter or width (e.g., spanning −x to x direction) of SROs 208, 209 can be same as a diameter of pads 106.

In another embodiment, the resist patterning can be performed prior to disposing pads 106 on top surface 105. For example, resist 206a, 206b, 206c, 206d, 206e can be formed by resist patterning using the mask with variable exposure, then pads 106 can be formed by metal plating. The usage of a mask with variable exposure level can pattern a resist layer to different resists with different thickness.

FIG. 2D illustrates another example of solder resist openings formed by a layer of resist with variable resist thickness in one embodiment. In an example shown in FIG. 2D, a resist layer that is thicker than resist layer 206 in FIG. 2B can be etched to form a plurality of SROs, such as SROs 218, 219. SROs 218, 219 can have greater height (e.g., z-direction) than SROs 208, 209 in FIG. 2C, respectively, due to the thicker resist layer. Due to the greater height, diameters of SROs 218, 219 can be etched to be smaller than diameters of SROs 208, 209 such that SROs 208, 218 can have the capacity to hold target solder volume 202, and SROs 209, 219 can have the capacity to hold target solder volume 204, without electrical open joints and/or solder bridging. In one embodiment, diameters of SROs with relatively smaller heights can be larger than diameters of pads 106. In an aspect, as a diameter of a SRO decreases, it may be increasingly difficult to fill solder into the SRO since the opening may become too small. Using a resist layer with an adjustable and variable thickness can avoid having SROs with significantly small diameter since the capacity of the SRO may not need to be solely dependent on the diameter, and can be controlled and be dependent on the resist layer thickness.

FIG. 2E illustrates an example of solder deposited in the solder resist openings shown in FIG. 2C. In an example shown in FIG. 2E, solder can be deposited into SROs 208 in FIG. 2C to form solder bumps 212c, and solder can be deposited into SROs 209 in FIG. 2C to form solder bumps 212f. Solder can be deposited into SROs 208, 209 using, for example, injection of molten solder (IMS) or solder paste printing techniques. Solder bumps 212c, 212f can have different solder volumes. Further, solder bumps 212c, 212f can have the same, or approximately the same, volumes as target solder volume 202, 204, respectively, shown in FIG. 2A. In one embodiment, solder can be filled in SROs 208, 209 until the resist and solder bumps 212c, 212f are planarized.

FIG. 2F illustrates an example of solder bumps formed by an implementation of optimized solder volume for flip-chip bonding in one embodiment. The resist shown in FIG. 2E can be removed or stripped in response to the deposition of solder into SROs 208, 209. In response to the removal, a structure can be formed as shown in FIG. 2F. Solder bumps 212c, 212f are formed and standing on pads 106 on top surface 105.

Figures 2G, 2H:
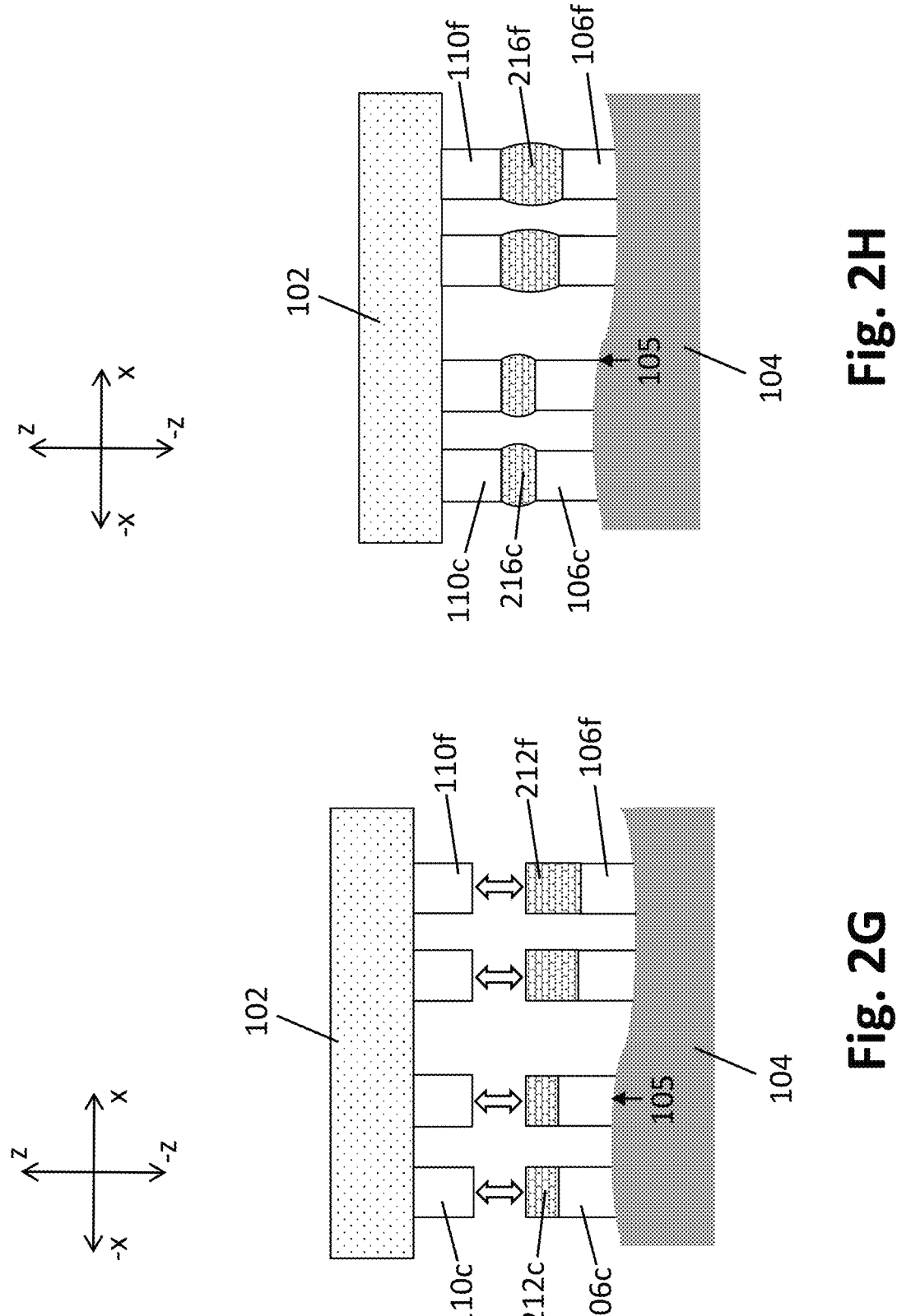
FIG. 2G illustrates an example of a combination of a first substrate and a second substrate as a result of an implementation of optimized solder volume for flip-chip bonding in one embodiment.
FIG. 2H illustrates an example package that can be formed by the combination shown in FIG. 2G.

FIG. 2G illustrates an example of a combination of a first substrate and a second substrate as a result of an implementation of optimized solder volume for flip-chip bonding in one embodiment. In the example shown in FIG. 2G, substrate 102 can be flip-chip mounted on substrate 104 by connecting pads 110 to solder bumps 212c, 212f. Upon the connection, a package can be formed as shown in FIG. 2H, where the connection causes solder bumps 212c, 212f to settle as solder joints, such as solder joints 216c, 216f. Solder joint 216c can connect pads 106c, 110c that are relatively closer to one another, and solder joint 216f can connect pads 106f, 110f that are relatively further from one another. Solder joints 216c, 216f can be of different sizes and can have optimized solder volume to prevent undesirable conditions such as electrical open joints and/or solder bridging.

FIG. 3A illustrates another example of a layer of resist with variable resist thickness in one embodiment. In an example shown in FIG. 3A, a layer of resist, labeled as resist layer 302, can be deposited on top surface 103 of substrate 102. Resist layer 302 can have variable thickness (e.g., vertical distance in z-direction from top surface 103 to peak of resist). In the example shown in FIG. 3A, one portion of resist layer 302 can have a thickness of T3, another portion of resist layer 302 can have a thickness of T4, and another portion of resist layer 302 can have a thickness of T5. T3 can be greater T4, and T4 can be greater than T5. In one embodiment, top surface 103 can be flat and thus the variable thickness of resist layer 302 define SROs having different sizes. In one embodiment, the different thicknesses of resist layer 302 across top surface 103 can be predetermined based on target solder volumes, such as target solder volumes 202, 204 in FIG. 2A.

In one embodiment, resist layer 302 can be formed by spin coating, such as dispensing liquid resist on substrate 102 then rotate substrate 102 at a specific rotational speed. In an aspect, resist layer formed by spin coating can have almost uniform thickness. To be described in more detail below, imitation pads can be added to top surface 103 to elevate the resist layer at certain locations, and pads can be removed from top surface 103 to lower the resist layer at certain locations. These adjustment to pads on top surface can cause variation in the thickness of the resist layer.

FIG. 3B illustrates another example of solder resist openings formed by a layer of resist with variable resist thickness in one embodiment. In an example shown in FIG. 3B, resist layer 302 in FIG. 3A can be etched to form a plurality of SROs, such as SROs 308, 309. SRO 308 can be defined or bounded by resists 302a, 302b, and pad 110f. In one embodiment, a mask and ultraviolet (UV) rays can be used for the resist patterning to form SROs 308, 309. The mask can have variable exposure levels such that the amount of resist removed from the top of pads 110c can be less than the amount of resist removed from the top of pads 110f. SRO 309 can be defined or bounded by resists 302d, 302e, and pad 110c. In response to the etching, resists 302a, 302b, 302c, and other resists, can remain on top surface 103. Resist 302a can have the thickness T3, resist 302b can have variable thickness including thickness T4, and resist 302c can have the thickness T5. Resist 302b may be deformed (e.g., not planarized) in order to have a variable thickness to form SROs of different sizes on the sides of resist 302b. For example, to form an SRO 309 that is smaller than SRO 308, resist 302b can have a slanted peak downwards towards pads 110c. SROs 308, 309 can comply with target solder volumes 202, 204 shown in FIG. 2A, such as having sufficient capacity to hold solder at target solder volumes 202, 204 without overflowing or unfilled portions. In the embodiment shown in FIG. 3B, a diameter or width (e.g., spanning –x to x direction) of SROs 308, 309 can be same as a diameter of pads 110.

In another embodiment, the resist patterning can be performed prior to disposing pads 110 on top surface 103. For example, resist 302a, 302b, 302c can be formed by resist patterning using the mask with variable exposure, then pads 110 can be formed by metal plating. The usage of a mask with variable exposure level can pattern a resist layer to different resists with different thickness.

Figure 3D:
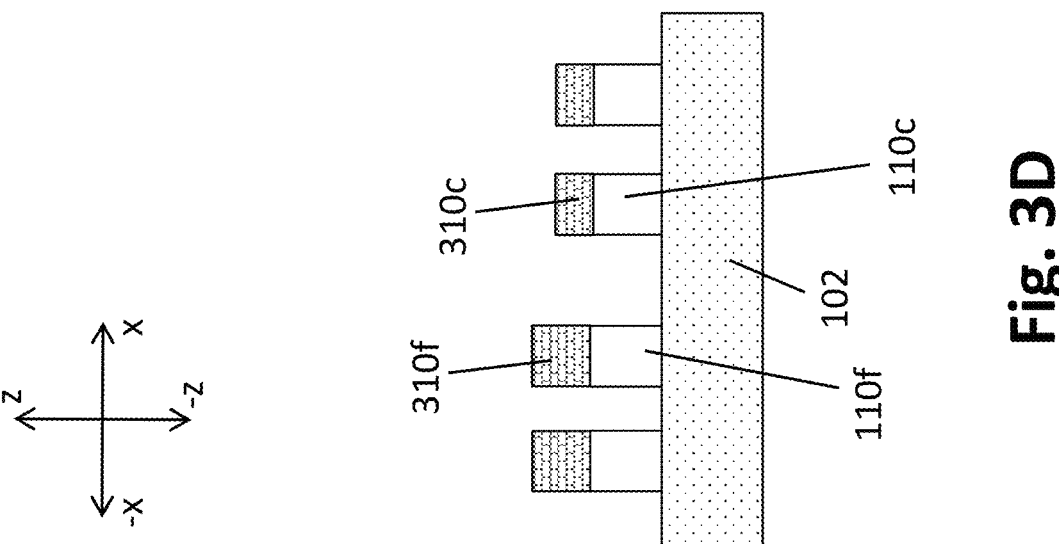
FIG. 3D illustrates another example of solder bumps formed by an implementation of optimized solder volume for flip-chip bonding in one embodiment.
Figure 3C:
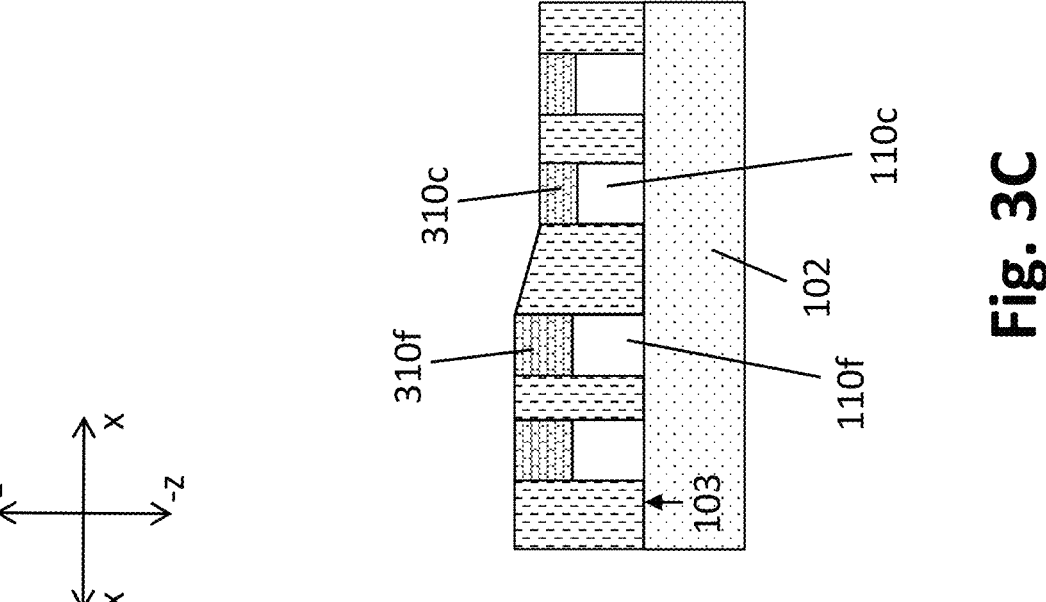
FIG. 3C illustrates another example of solder deposited in the solder resist openings shown in FIG. 3B.

FIG. 3C illustrates another example of solder deposited in the solder resist openings shown in FIG. 3B. In an example shown in FIG. 3C, solder can be deposited into SROs 308 in FIG. 3B to form solder bumps 310f, and solder can be deposited into SROs 309 in FIG. 3B to form solder bumps 310c. Solder can be deposited into SROs 308, 309 using, for example, injection of molten solder (IMS) or solder paste printing techniques. Solder bumps 310c, 310f can have different solder volumes. Further, solder bumps 310c, 310f can have the same, or approximately the same, volumes as target solder volume 202, 204, respectively, shown in FIG. 2A.

FIG. 3D illustrates another example of solder bumps formed by an implementation of optimized solder volume for flip-chip bonding in one embodiment. Resist layer 302 in FIG. 3B can be removed or stripped, resulting in a structure shown in FIG. 3D. In FIG. 3D, solder bumps 310c, 310f are formed and standing on pads 110 on top surface 103. Solder bumps 310c, 310f can be formed with solder volume that is the same, or approximately the same, as target solder volumes 202, 204 in FIG. 2A.

Figure 3F:
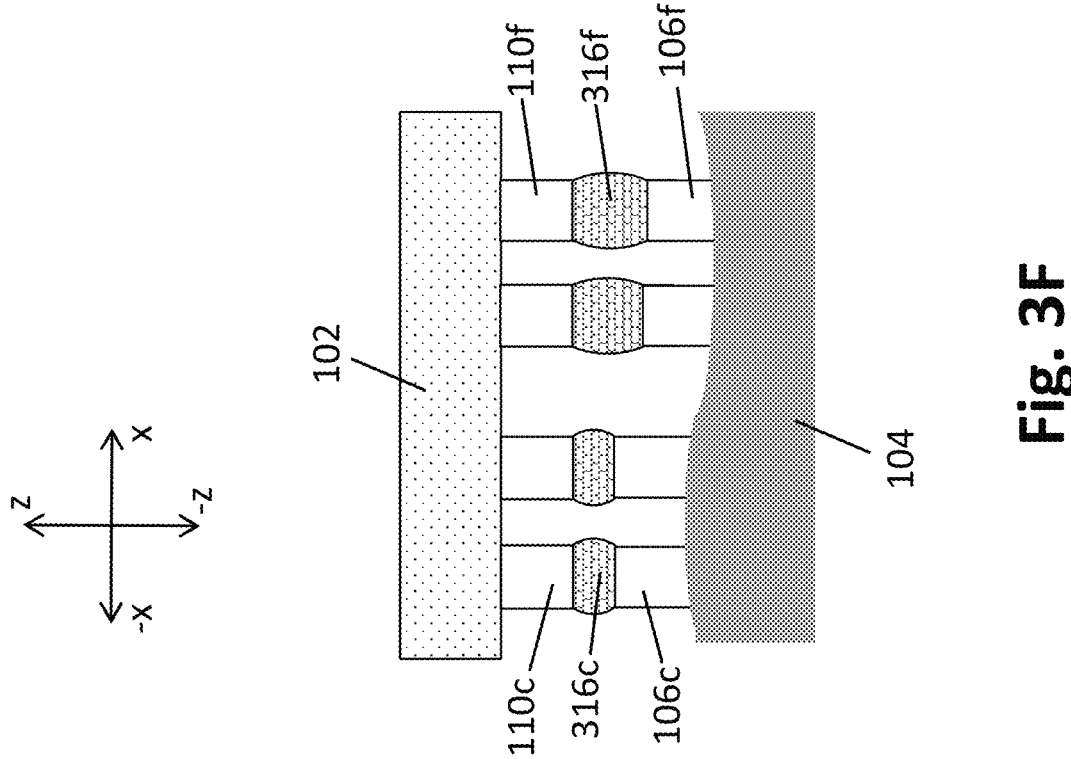
FIG. 3F illustrates an example package that can be formed by the combination shown in FIG. 3E.
Figure 3E:
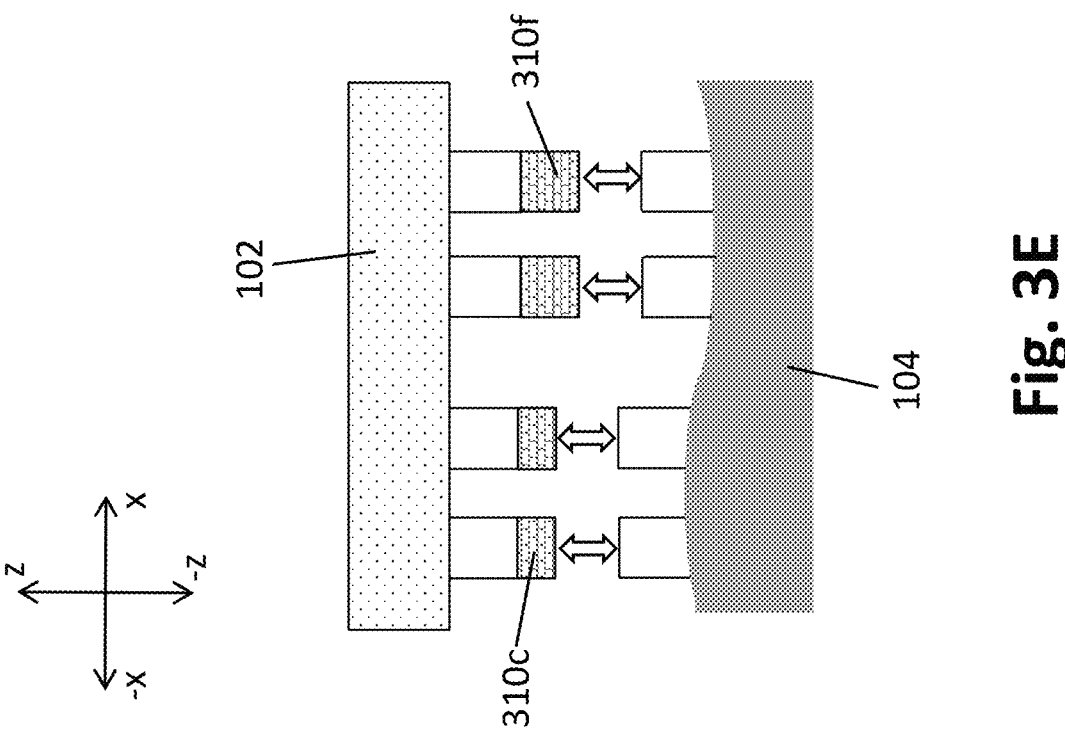
FIG. 3E illustrates another example of a combination of a first substrate and a second substrate as a result of an implementation of optimized solder volume for flip-chip bonding in one embodiment.

FIG. 3E illustrates another example of a combination of a first substrate and a second substrate as a result of an implementation of optimized solder volume for flip-chip bonding in one embodiment. In the example shown in FIG. 3E, substrate 102 can be flip-chip mounted on substrate 104 by connecting solder bumps formed on pads 110 to pads 106 of substrate 104. Upon the connection, a package can be formed as shown in FIG. 3F, where the connection causes solder bumps 310c, 310f to settle as solder joints. The solder joints formed can be of different sizes and can have optimized solder volume to prevent undesirable conditions such as electrical open joints and/or solder bridging.

Figure 4B:
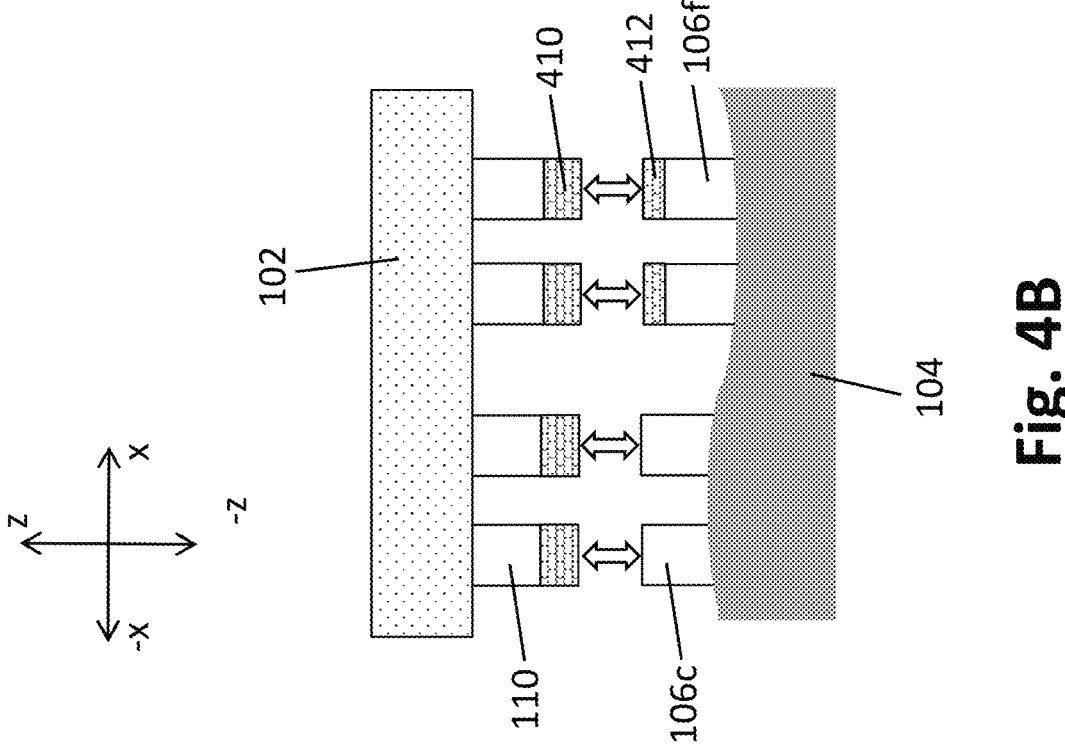
FIG. 4B illustrates another example of solder bumps formed by an implementation of optimized solder volume for flip-chip bonding in one embodiment.
Figure 4A:
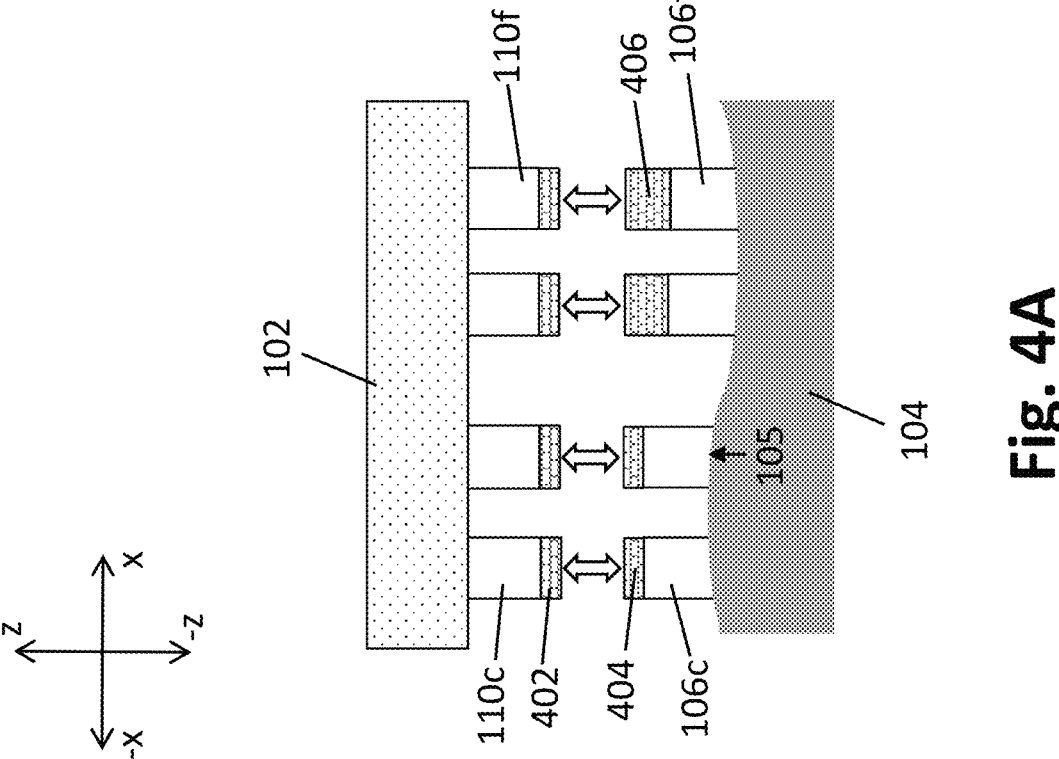
FIG. 4A illustrates another example of solder bumps formed by an implementation of optimized solder volume for flip-chip bonding in one embodiment.

FIG. 4A illustrates another example of solder bumps formed by an implementation of optimized solder volume for flip-chip bonding in one embodiment. In an example shown in FIG. 4A, solder bumps 402 having uniform size can be formed on pads 110 of substrate 102, and solder bumps having different sizes, such as solder bumps 404, 406, can be formed on pads 106 of substrate 104. A resist layer having uniform thickness can be used for forming solder bumps 402 on pads 110 of substrate 102. A resist layer having variable thickness can be used for forming solder bumps 404, 406 on pads 106 of substrate 104. Substrate 102 can be flip-chip mounted on substrate 104 by connecting solder bumps 402 formed on pads 110 to solder bumps 404, 406 formed on pads 106. Upon the connection, a combination of solder bumps 402, 404 can result in a solder joint having volume that can be the same, or approximately the same, as target solder volume 202 in FIG. 2A. A combination of solder bumps 402, 406 can result in a solder joint having volume that can be the same, or approximately the same, as target solder volume 204 in FIG. 2A.

FIG. 4B illustrates another example of solder bumps formed by an implementation of optimized solder volume for flip-chip bonding in one embodiment. In an example shown in FIG. 4B, solder bumps 410 having uniform size can be formed on pads 110 of substrate 102, and solder bumps 412 having same or different sizes can be formed on a portion of pads 106 of substrate 104. In the example shown in FIG. 4B, solder bumps 412 can be formed on pads 106 with peaks that are relatively shorter, such as pads 106f. No solder bumps are formed on pads 106 with peaks that are relatively taller, such as pads 106c. A resist layer having uniform thickness can be used for forming solder bumps 410 on pads 110 of substrate 102. A resist layer having variable thickness can be used for forming solder bumps 412 on pads 106f of substrate 104. Substrate 102 can be flip-chip mounted on substrate 104 by connecting solder bumps 410 formed on pads 110 to pads that has no solder bumps (e.g., pads 106c) and solder bumps 412 formed on pads 106f. Upon the connection, a combination of solder bumps 410 with pads 106c can result in solder joints having volume that can be the same, or approximately the same, as target solder volume 202 in FIG. 2A. A combination of solder bumps 410 with solder bumps 412 can result in solder joints having volume that can be the same, or approximately the same, as target solder volume 204 in FIG. 2A.

Figure 5A:
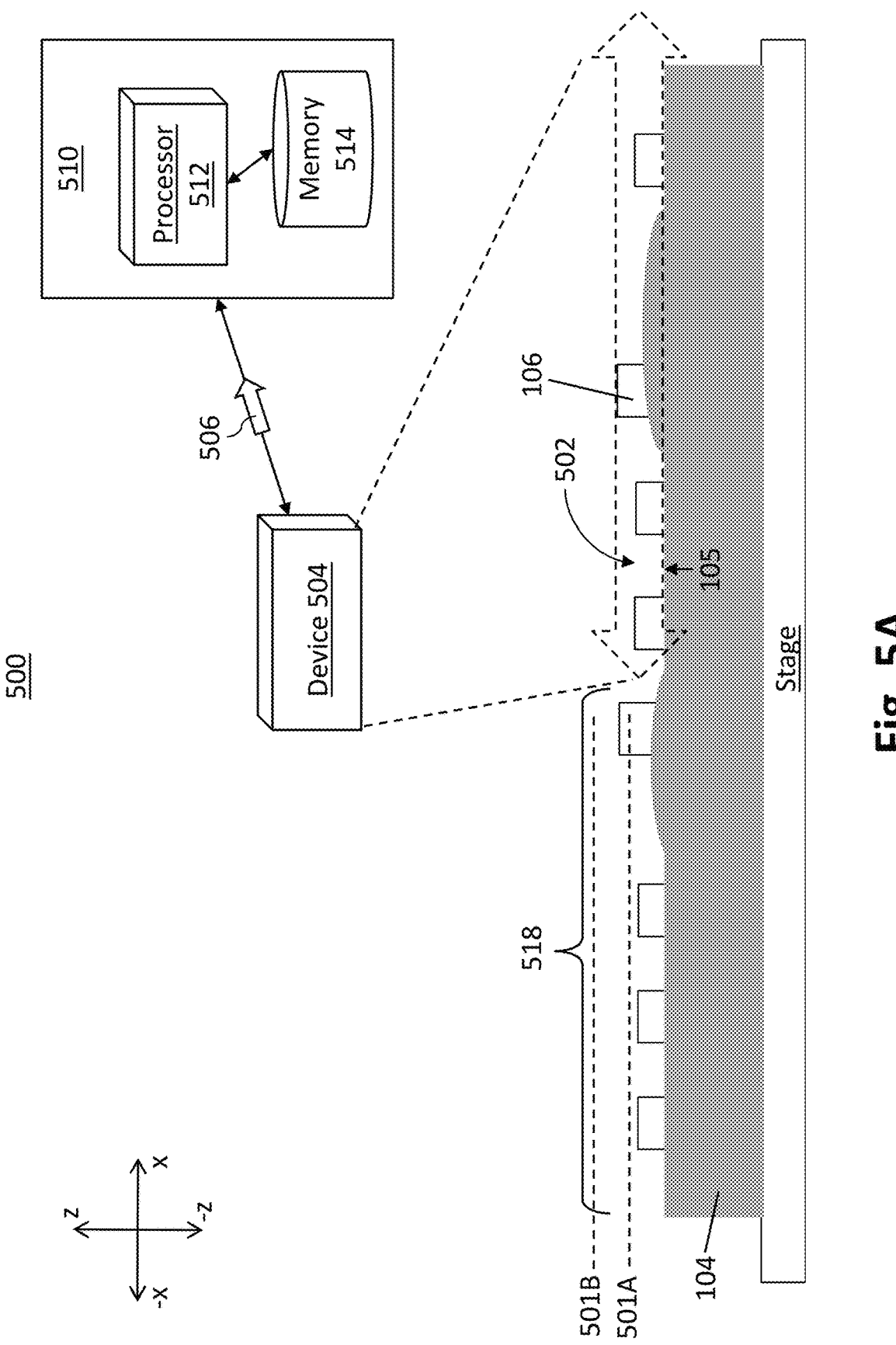
FIG. 5A illustrates an example system 500 that can implement optimized solder volume for flip-chip bonding in one embodiment.

FIG. 5A illustrates an example system 500 that can implement optimized solder volume for flip-chip bonding in one embodiment. System 500 can include a device 504 and a device 510. Device 504 can be configured to obtain a surface topology of top surface 105. In one embodiment, device 504 can be a laser sensor that can scan at least a portion of top surface 105 and generate two-dimensional (2D) and/or three-dimensional (3D) surface topologies of top surface 105. Device 510 can be a computing device including at least a processor 512 and a memory 514. Memory 514 can be configured to store instructions, such as program code (e.g., source code and/or executable code). Processor 512 can be configured to run or implement the instructions stored in memory 514 to perform the at least some of the operations described herein, such as determination of target solder volume (e.g., FIG. 2A), determination of resist thickness, determination of SROs, identification of portions of surfaces that need imitation pads or pads removed, determination of adjustments to exposure levels across different portions of a resist mask, and/or other operations described herein.

By way of example, device 504 can scan at least a portion, such as a portion 502, of top surface 105 of substrate 104 and generate surface topology data 506. Surface topology data 506 can be, for example, digital data (e.g., digital image data) representing a surface topology of portion 502 scanned by device 504. Device 504 can send surface topology data 506 to device 510. Device 504 can also scan at least a portion of top surface 103 of substrate 102 (see FIG. 1) and generate surface topology data for top surface 103, and can send the generated surface topology data for top surface 103 to device 510.

In one embodiment, processor 512 can determine a plurality of target solder volumes (e.g., see FIG. 2A). Each target solder volume can correspond to one pad among pads 106, and one pad among pads 110. Each target solder volume can be an amount of solder that can be used for bonding corresponding pads 106, 110 without electrical open joints and/or solder bridging. By way of example, processor 512 can be configured to simulate a flip-chip mounting process to mount substrate 102 to substrate 104. The simulation can show solder volume being used for bonding each pad 106 to a corresponding pad 110, pads 110 without electrical open joints and/or solder bridging. This solder volumes obtained from the simulation can be set as target solder volumes.

In another embodiment, processor 512 can perform a process to determine virtual planes and ideal heights for determining target solder volumes. By way of example, processor 512 can determine a first virtual plane 501A that is parallel to a stage being used for bonding substrate 102 and substrate 104. The first virtual plane 501A can have portions that can be lower than relatively taller pads (e.g., pads 106c in FIG. 2A) and portions that can be higher than relatively shorter pads (e.g., pads 106f in FIG. 2A). An ideal height of target solder volumes can be determined based on pad diameters and pitches. Different pad diameters and pitches can have different threshold solder volumes for electrical open joints and solder bridging. Lower limits of the ideal height can be a threshold where electrical open joints can occur, and upper limits of the ideal height can be a threshold where solder bridging can occur. Processor 512 can determine the ideal height and add the ideal height to first virtual plane 501A to determine a second virtual plane 501B. Processor 512 can determine target solder volumes by determining differences between each pad 106 and second virtual plane 501B.

Processor 512 can be configured to determine different thicknesses of different portions of a resist layer to be deposited across top surface 105. The different thicknesses can define a plurality of SROs having sizes that comply with the plurality of target solder volumes, such as having sufficient capacity to hold an amount of solder equivalent to the target solder volumes without electrical open joints and/or solder bridging. In one embodiment, processor 512 can determine a height (e.g., z-direction) and a diameter (e.g., x-direction) of each SRO to be formed on pads 106 in portion 502. Based on the determined height and/or diameter, processor 512 can determine different resist thicknesses of resist to be deposited on top surface 105 and in-between pads 106. Using FIG. 2C as an example, processor 512 can determine that in order to form SRO 208 that complies with target solder volume 202 in FIG. 2A, a portion of resist between two pads 106c needs a thickness of T1. Also, in order to form SRO 209 that complies with target solder volume 204 in FIG. 2A, a portion of resist between pads 106c and pad 106f needs a thickness of T2.

In one embodiment, processor 512 can determine the different thicknesses of resist across top surface 105 in a piecewise manner. Device 504 can scan different portions of top surface, such as scanning portion 502 and another portion 518 at different times. The surface topology data of portions 502, 518 can be provided to processor 512 as separate pieces of data. Processor 512 can perform a first determination of the different thicknesses for portion 502, and can perform a second determination of the different thicknesses for portion 518. The size of portions of top surface 105 to be scanned separately can be arbitrary.

In order to achieve the determined resist thickness during formation of a package based on variable resist thickness (e.g., package 100 in FIG. 1), processor 512 can use surface topology data received from device 504 to generate data that can be used by apparatuses that construct or form the package. In one embodiment, processor 512 can generate pad density adjustment data that indicates additions imitation pads and/or removal of pads from top surfaces 103, 105. In another embodiment, processor 512 can generate exposure adjustment data that indicates different exposure levels for different portions of a mask being used for performing resist patterning.

By way of example, processor 512 of device 510 can receive surface topology data 506 and use surface topology data 506 to determine a pad density of portion 502. Processor 512 of device 510 can also receive the surface topology data for top surface 103 and determine a pad density of top surface 103. In one or more embodiments, processor 512 can run instructions stored in memory 514 to perform various image processing techniques on images in surface topology data 506 in order to extract data necessary for determining pad densities.

Figure 5B:
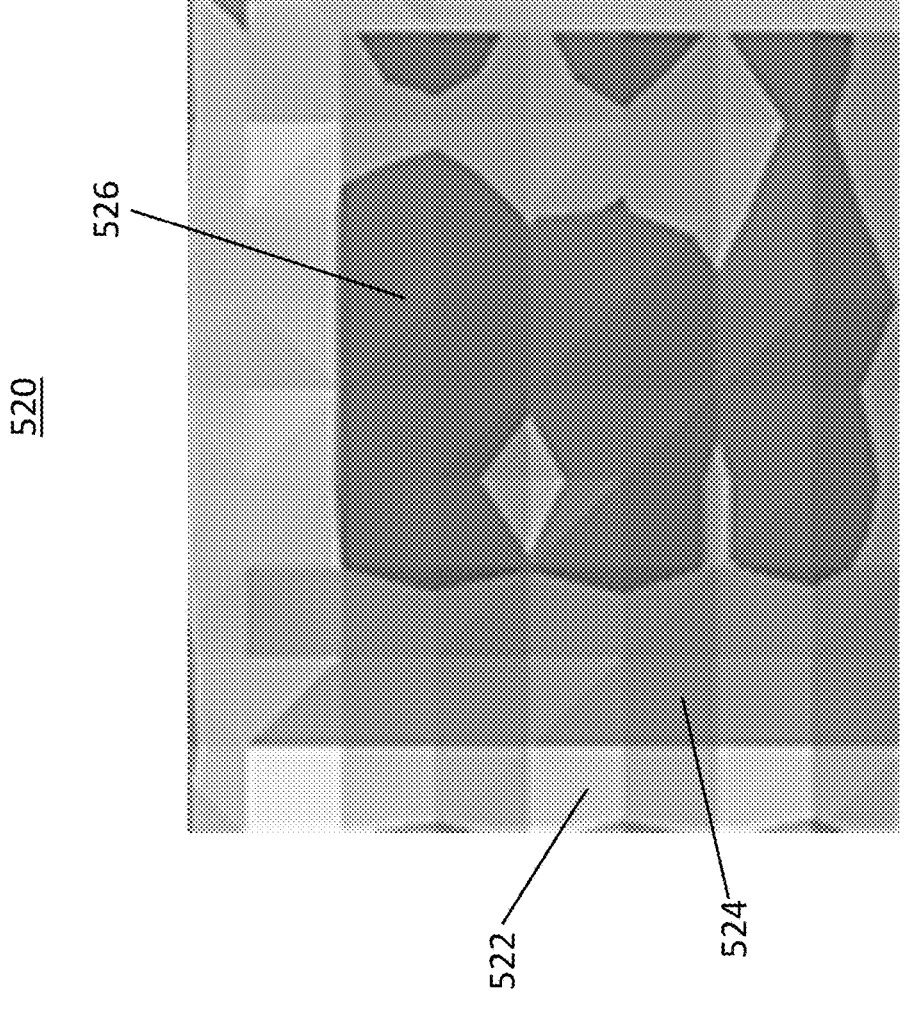
FIG. 5B illustrates an example image that can be included in surface topology data in one embodiment.

FIG. 5B shows an example of an image 520 that can be included in surface topology data 506 generated by device 504. In an aspect, the surface topology of portion 502 of top surface 105 can indicate a surface topography, visually represented by an image 520, of portion 502. The surface topology can indicate attributes such as depth measurements between peaks of the plurality of pads 106 and top surface 105 (e.g., peak-to-valley depths along the z axis). The depth measurements indicated by the surface topology can reflect undulations across portions 502 of top surface 105. In the example shown in FIG. 5B, a shade 522 can represent a lowest (e.g., smallest z-value) height on scanned portion 502, a shade 526 can represent a highest (e.g., greatest z-value) height on scanned portion 502, and other shades, such as shade 524, can represent heights between the highest and lower heights on scanned portion 502.

Figure 6B:
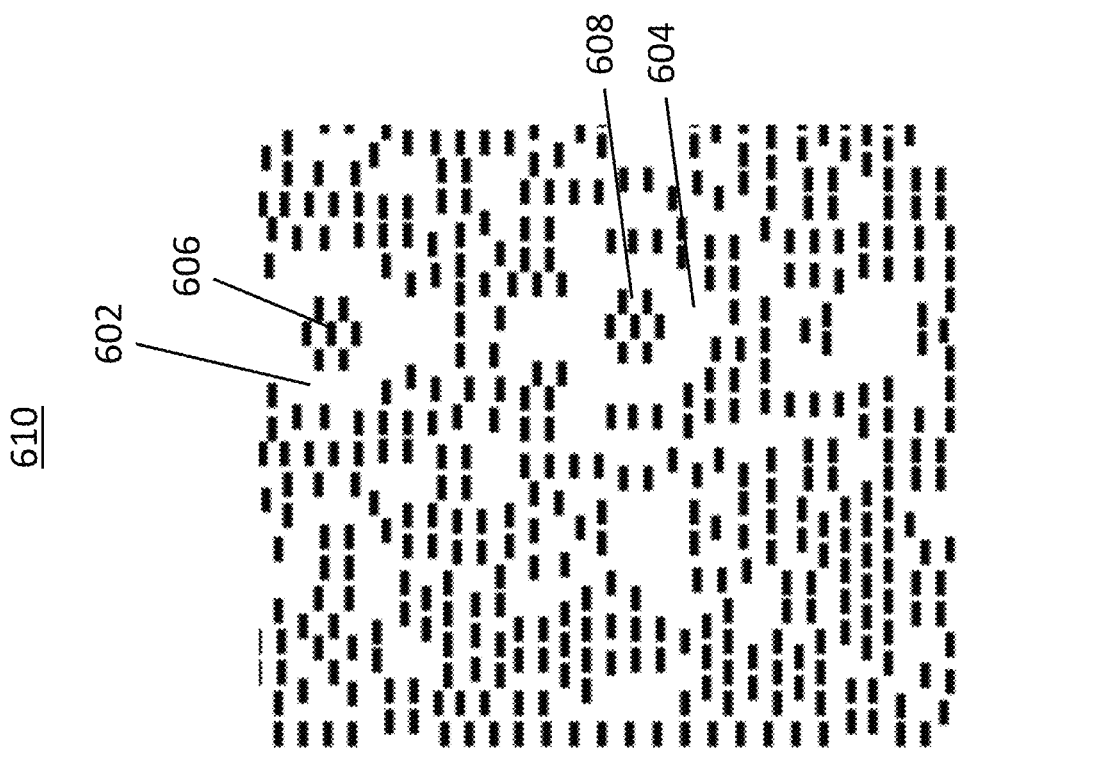
FIG. 6B illustrates another example image that can be used in generation pad density adjustment data in one embodiment.
Figure 6A:
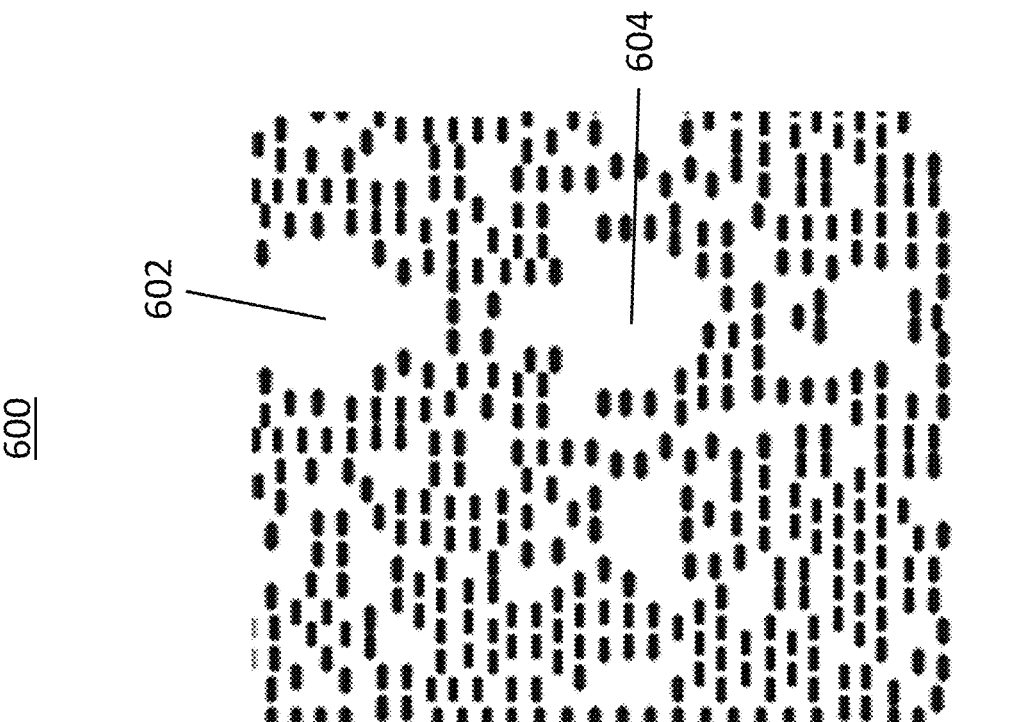
FIG. 6A illustrates an example image that can be used in generation pad density adjustment data in one embodiment.

FIG. 6A illustrates an example image that can be used in generation pad density adjustment data in one embodiment. In one embodiment, processor 512 can use surface topology data 506 and/or image 520 to determine a pad density of top surface 105 (see FIG. 5A). In an example shown in FIG. 6A, processor 512 can convert image 520 (FIG. 5B) into a pad density image 600. Pad density image 600 can be a digital image, such as bitmap data or raster image, showing a layout of pads on scanned portion 502. Processor 512 can be configured to determine whether portions of pad density image 600 has a pad density within a predetermined range of pad density thresholds. In response to a specific portion having a pad density within the range of predetermined pad density thresholds, processor 512 can identify the specific portion as a portion that does not need pad density adjustment. In response to a specific portion having a pad density greater than the greatest value in the range of predetermined pad density thresholds, processor 512 can identify the specific portion as a portion that needs pads removed to decrease its pad density. In response to a specific portion having a pad density less than the least value in the range of predetermined pad density thresholds, processor 512 can identify the specific portion as a portion that needs imitation pads added to increase its pad density.

Referring to pad density image 600, portions with relatively lower pad density, such as portions 602, 604, can have relatively thinner layer of resist if resist is being deposited on portion 502 without adjustment to pad density. Processor 512 can identify portions 602, 604 as portions that need an increase in pad density, and can generate pad density adjustment data indicating the need to add imitation pads in portions 602, 604 of top surface 105. Referring to FIG. 6B, the pad density adjustment data can indicate at least one imitation pad 606 can be added to portion 602, and at least one imitation pad 608 can be added to portion 604. The addition of imitation pads 606, 608 can increase a pad density of portions 602, 604. By adding imitation pads 606, 608 to increase pad density of portions 602, 604, resists being deposited on portions 602, 604 and surrounding areas can result in thicker resist. In some embodiments, pads can also be removed from portions that may be considered overly dense to reduce resist thickness. In another embodiment, processor 512 can identify portions 602, 604 as portions that need an increase in pad density, and can generate pad density adjustment data indicating the need to increase diameters of pads within a vicinity of (or surrounding) the identified portions 602, 604. The increased diameters of these pads can increase a pad density of portions 602, 604.

Figure 6D:
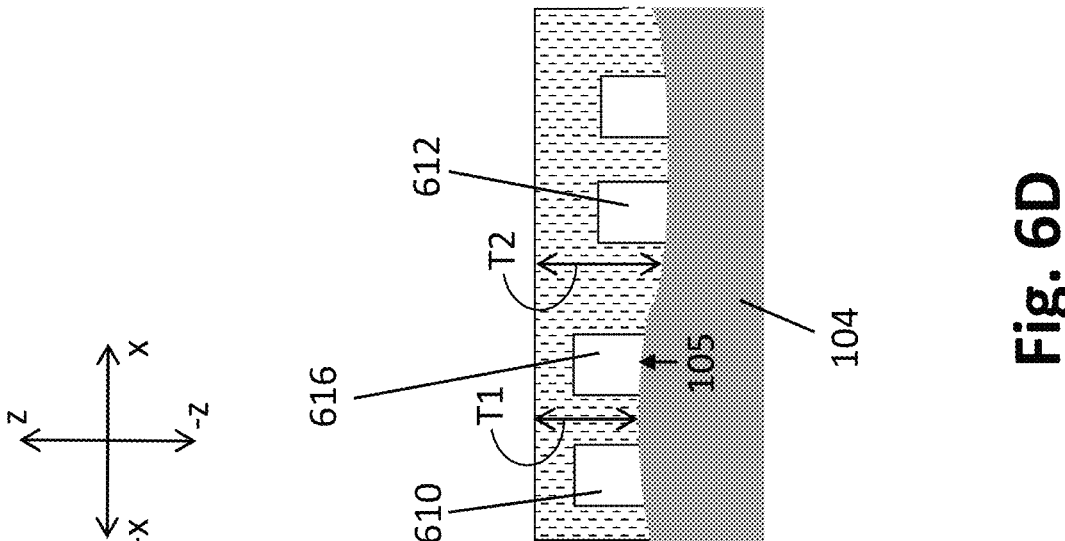
FIG. 6D illustrates a cross-sectional area of the portion in FIG. 6C with an addition of an imitation pad in one embodiment.
Figure 6C:
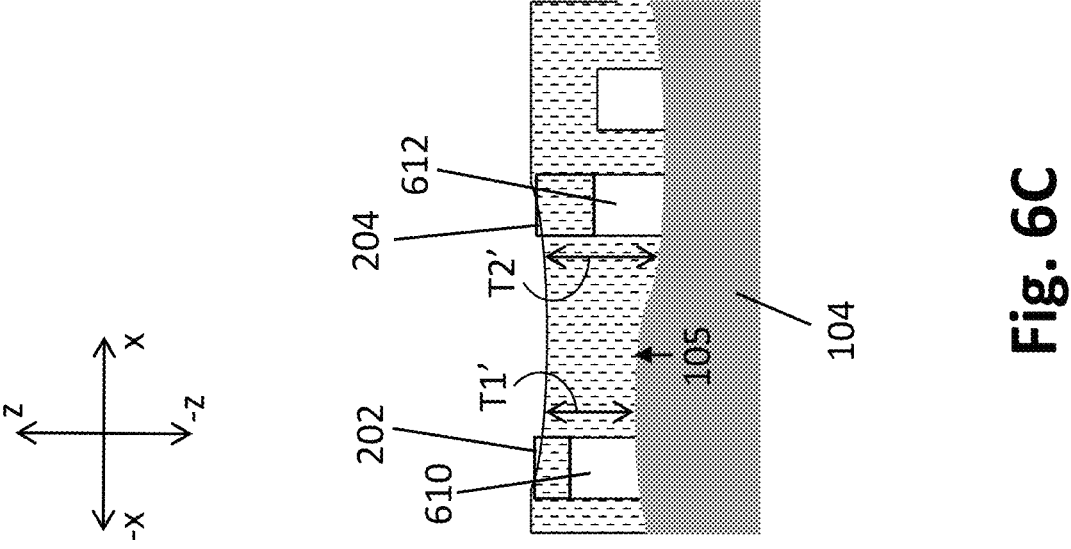
FIG. 6C illustrates a cross-sectional area of a portion that has relatively lower pad density in one embodiment.

FIG. 6C illustrates a cross-sectional area of a portion that has relatively lower pad density in one embodiment. A portion of top surface 105 shown in FIG. 6C. This portion can have a relatively lower pad density, as shown by a relatively far distance between a pad 610 and a pad 612. Due to the lower pad density, a resist layer being formed on top surface 105 may be lowered at the portion between pads 610, 612. This lowered portion of the resist layer can result in SROs that do not comply with target solder volumes 202, 204. For example, an SRO to be formed on pad 610 can be bounded by a resist pattern having a thickness T1', instead of a determined thickness T1 (see FIG. 2A). An SRO to be formed on pad 612 can be bounded by a resist pattern having a thickness T2', instead of a determined thickness T2 (see FIG. 2A).

FIG. 6D illustrates a cross-sectional area of the portion in FIG. 6C with an addition of an imitation pad in one embodiment. In FIG. 6D, an imitation pad 616 is added to the portion shown in FIG. 6C. As a result of adding imitation pad 606, the resist layer between pads 610, 612 can be elevated and SROs being formed on top of pads 610, 612 can be bounded by resist patterns with the determined thicknesses T1, T2.

Therefore, processor 512 can be configured to use surface topology data 506 generated by device 504 to determine adjustment to resist thickness at different portions across top surface 105. Processor 512 can determine which portions on the scanned surface (e.g., portion 502) may need imitation pads to increase resist thickness, or which portions may need pads removed to reduce resist thickness. By using surface topology of top surface 105 to adjust resist thickness, the thickness of a resist layer being formed on top surface 105 can vary across top surface 105, and solder resist openings bounded by the resist layer can vary in size and/or dimensions as well. The varying solder resist openings can allow solder bumps with different sizes and/or dimensions, solder bumps that comply with target solder volumes, to be formed on pads 106.

Figure 7A:
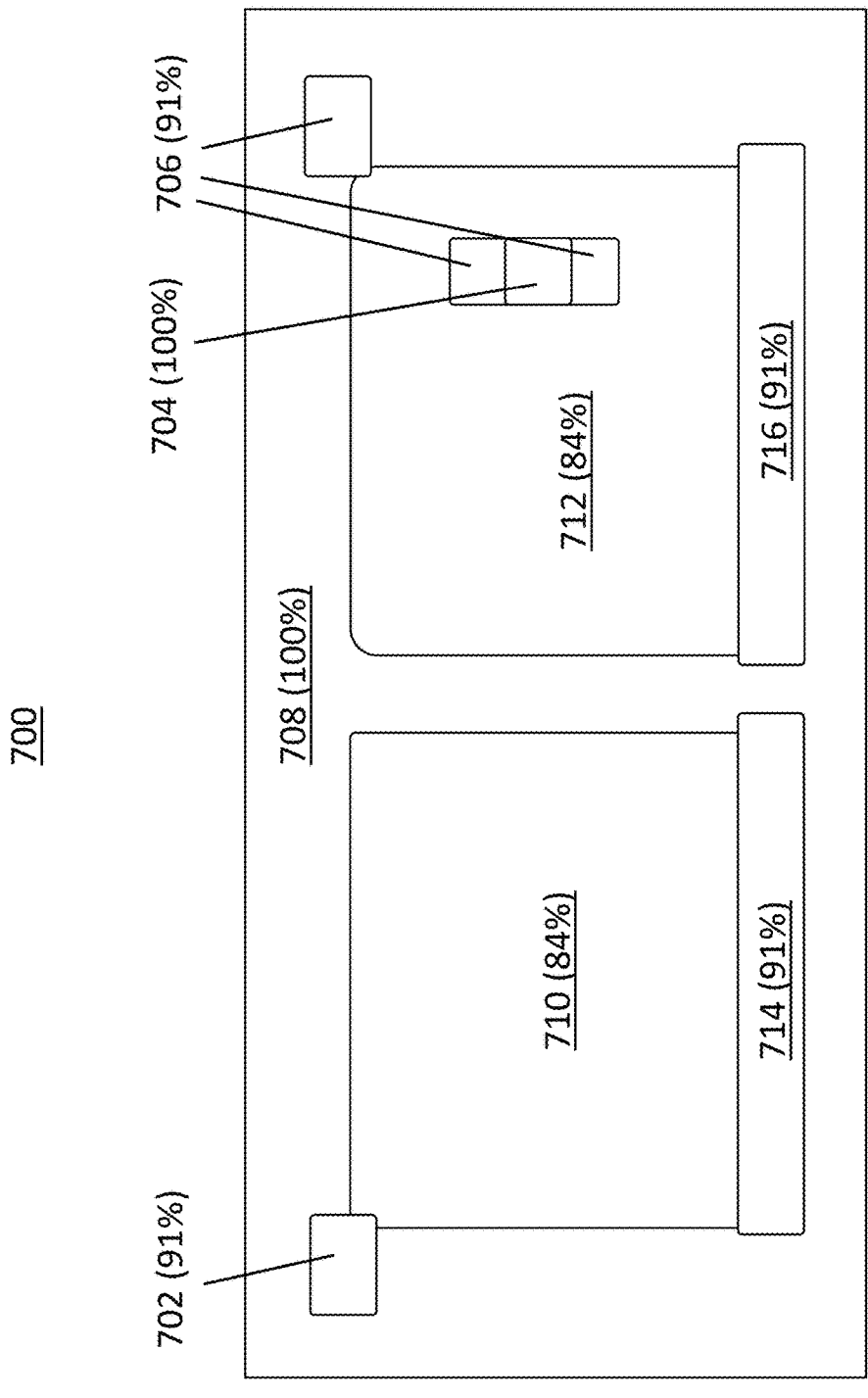
FIG. 7A illustrates an example layout of a mask with variable exposure levels in one embodiment.

FIG. 7A illustrates an example layout of a mask with variable exposure levels in one embodiment. A mask 700 is shown in FIG. 7A. In one embodiment, mask 700 can be a photomask, can be an opaque plate or film coated with transparent, patterned, or opaque areas. In another embodiment, mask 700 can be a grayscale mask having different areas with different intensity levels for modulating UV light rays. The different exposure levels being determined by processor 512 can be different intensity levels of the grayscale mask. Processor 512 can generate exposure level adjustment data that can be used for designing and manufacturing mask 700 with variable exposure levels.

In the example shown in FIG. 7A, mask 700 can include areas 704, 708 that has an exposure level of 100%. An exposure level of 100% can allow UV light rays to fully penetrate mask 700. Mask 700 can further include areas 702, 706, 714 having exposure level of 91%, and areas 710, 712 having exposure level of 84%. Exposure level of 91% can allow 91% of UV light rays to pass through mask 700, and exposure level of 84% can allow 84% of light rays to pass through mask 700.

Figure 7C:
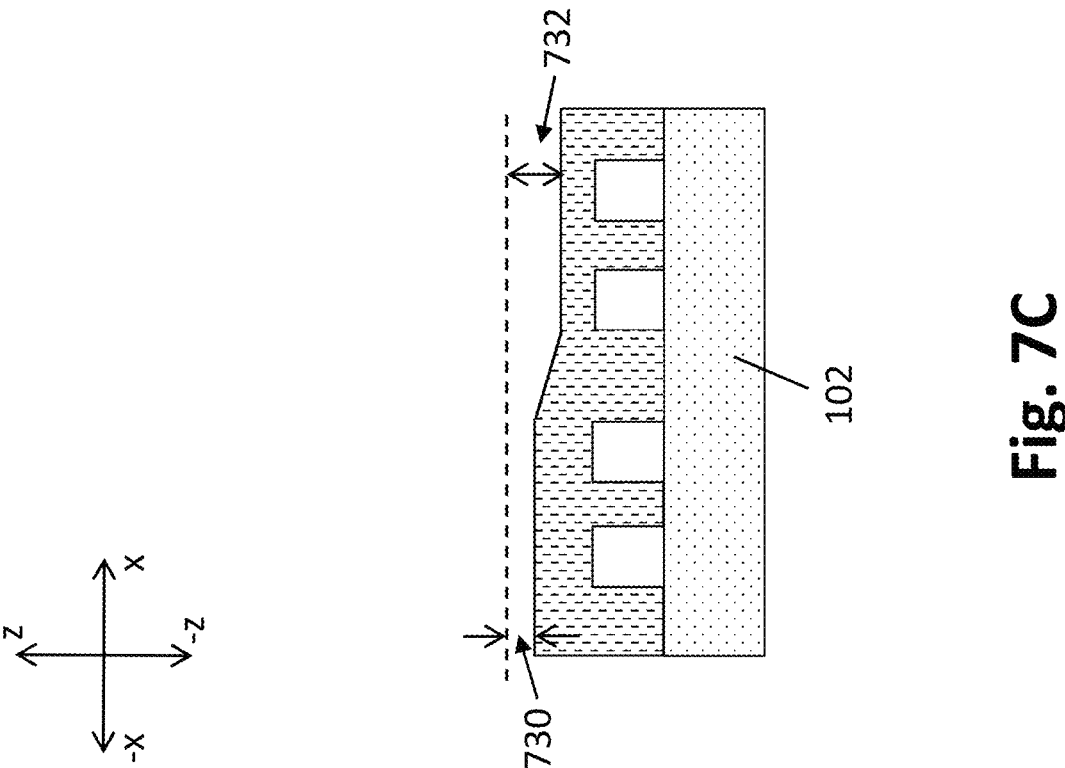
FIG. 7C illustrates a cross-sectional area of a portion that has resist patterns formed by a mask with variable exposure levels in one embodiment.
Figure 7B:
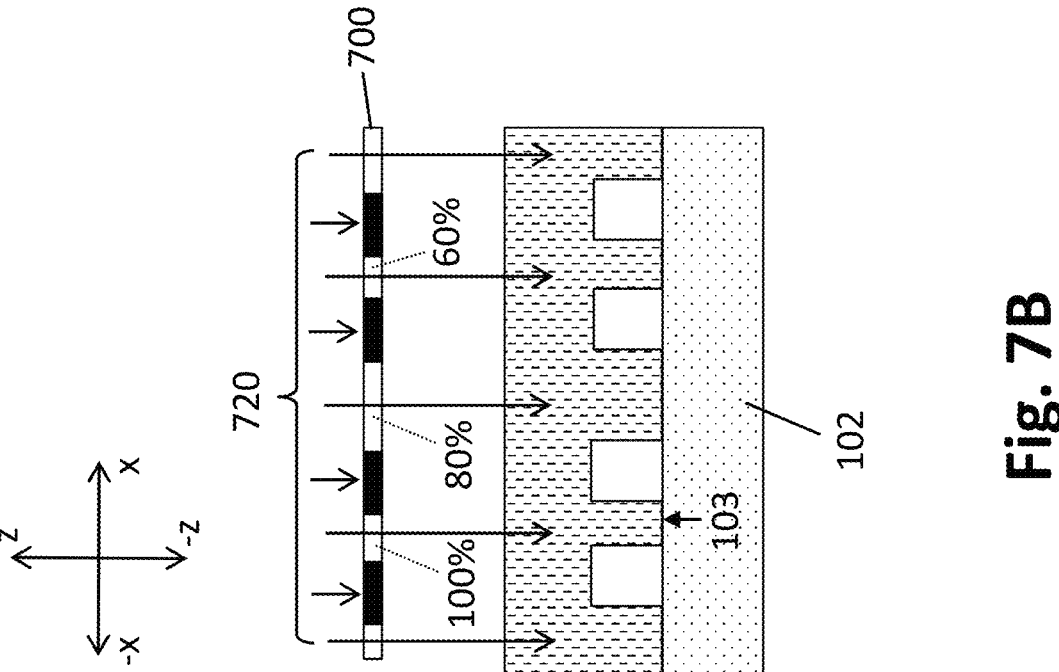
FIG. 7B illustrates a cross-sectional area of a portion that has solder resist openings formed by a mask with variable exposure levels in one embodiment.

Referring to FIG. 7B, as a result of using mask 700 with variable exposure levels, UV light rays 720 can pass through mask 700 through the areas with different exposure levels to form a resist layer with variable thickness on top surface 103 of substrate 102, where top surface 103 can be flat and have uniform pad density. In the example shown in FIG. 7B, mask 700 can include areas with different exposure levels, such as 100%, 80%, 60%, or other exposure levels. The example in FIG. 7B shows an implementation of using negative tone photoresist, such that exposure levels that are relatively higher can cause a smaller height reduction of resist materials when compared to lower exposure levels. Referring to FIG. 7C, as a result of the implementation shown in FIG. 7B, a resist layer having variable thickness can be formed. The variable exposure levels causes a different height reduction of resist materials, such as a smaller height reduction 730 resulting from a 100% exposure level and a larger height reduction 732 resulting from a 60% exposure level. Resist patterning can be performed on the structure in FIG. 7C to form SROs on pads of substrate 102.

In another embodiment, the resist layer shown in FIG. 7C can be formed using maskless laser lithography techniques without mask 700, where the resist pattern is exposed directly onto top surface 105 using a spatial light modulator. In another embodiment, positive tone photoresist can be used for forming resist layers with variable thickness. In one embodiment, the pad density adjustment and exposure level adjustment can both be applied to achieve the determined resist thickness. For example, the resist layers described herein can be formed with imitation pads on surfaces of substrates, and the resist layers formed with imitation pads can be patterned using a mask with variable exposure levels. Positive tone photoresist or negative tone photoresist can be used for forming resist layers with variable thickness on surfaces with uniform pad density and surfaces with variable pad densities.

FIG. 8 illustrates a flow diagram relating to an implementation of optimized solder volume for flip-chip bonding in one embodiment. The process 800 in FIG. 8 may be implemented to form, for example, resist layers with variable thicknesses as discussed above. The process 800 can include one or more operations, actions, or functions as illustrated by one or more of blocks 802 and/or 804. Although illustrated as discrete blocks, various blocks may be divided into additional blocks, combined into fewer blocks, eliminated, performed in different order, or performed in parallel, depending on the desired implementation.

Process 800 can be performed by a computing device or a processor, such as processor 512 in FIG. 5A, to determine different thicknesses for a resist layer. Process 800 can begin at block 802. At block 802, a processor can determine a plurality of target solder volumes to be deposited on a plurality of pads on a surface of a substrate. The plurality of target solder volumes can be variable among the plurality of pads. Process 800 can proceed from block 802 to block 804. At block 804, the processor can determine different thicknesses of different portions of a layer of resist to be deposited across the surface of the substrate. The different thicknesses can define a plurality of solder resist openings having sizes that comply with the plurality of target solder volumes.

In one embodiment, the processor can receive a surface topology of the surface of the substrate. The surface topology can indicate depth measurements between peaks of the plurality of pads and the surface of the substrate. Based on the surface topology, the processor can generate pad density adjustment data indicating an adjustment to a pad density of the surface of the substrate for achieving the determined different thicknesses of the different portions of the layer of resist.

In one embodiment, based on the surface topology, the processor can determine pad densities of different portions of the surface of the substrate. The processor can identify at least one portion of the surface of the substrate having a pad density that does not satisfy a threshold. The processor can generate the pad density adjustment data for adjusting the pad density of the at least one portion of the surface of the substrate.

In one embodiment, the processor can identify a portion of the surface of the substrate that has a pad density lower than the threshold. The processor can generate the pad density adjustment data to indicate an addition of at least one imitation pad to the at least one portion of the surface of the substrate. The addition of the at least one imitation pad can increase the pad density of the identified portion of the surface, and the increased pad density increases a thickness of the layer of resist at the identified portion of the surface.

In one embodiment, the processor can identify a portion of the surface of the substrate that has a pad density greater than the threshold. The processor can generate the pad density adjustment data to indicate a removal of at least one pad from the at least one portion of the surface of the substrate. The removal of the at least one pad can decrease the pad density of the identified portion of the surface, and the decreased pad density decreases a thickness of the layer of resist at the identified portion of the surface.

In one embodiment, the processor can generate exposure adjustment data for adjusting exposure levels of a mask being used for patterning the layer of resist. The adjustment to the exposure levels of the mask can be for achieving the determined different thicknesses of the different portions of the layer of resist. In one embodiment, the mask can be a grayscale mask, and the exposure adjustment data indicates adjustment to intensity levels of the grayscale mask.

In one embodiment, the processor can generate the exposure adjustment data by identifying a portion of the surface of the substrate that corresponds to a particular thickness among the different thicknesses. The processor can further generate the exposure adjustment data to adjust an exposure level of a portion of the mask that corresponds to the identified portion of the surface of the substrate. The adjusted exposure level can cause the layer of resist to have the particular thickness.

Figure 9:
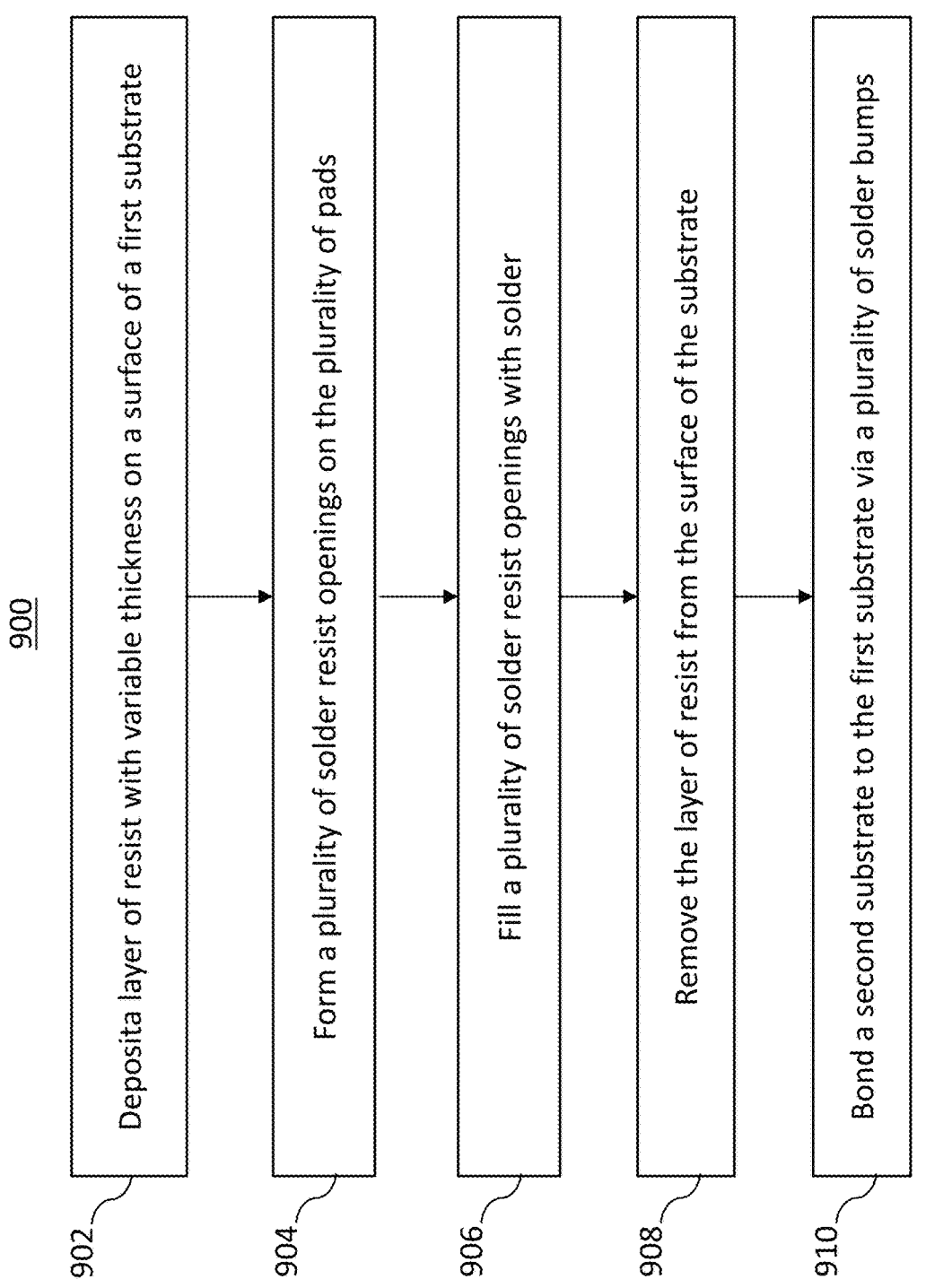
FIG. 9 illustrates a flow diagram for forming a package based on optimized solder volume for flip-chip bonding in one embodiment.

FIG. 9 a flow diagram for forming a package based on optimized solder volume for flip-chip bonding in one embodiment. The process 900 in FIG. 9 may be implemented to form, for example, packages such as package 100 discussed above. The process 900 can include one or more operations, actions, or functions as illustrated by one or more of blocks 902 and/or 904. Although illustrated as discrete blocks, various blocks may be divided into additional blocks, combined into fewer blocks, eliminated, performed in different order, or performed in parallel, depending on the desired implementation.

Process 900 can be performed to form a semiconductor package. Process 900 can begin at block 902. At block 902, a layer of resist can be deposited on a surface of a first substrate. The first substrate can include a plurality of pads, different portions of the layer of resist have different thicknesses, and the different thicknesses are based on a plurality of predetermined target solder volumes. In one embodiment, the different thicknesses can be based on a pad density of the surface of the substrate. In one embodiment, the different thicknesses can be based on variable exposure levels of a mask being used for patterning the layer of resist. In one embodiment, the first substrate includes at least one imitation pad that is not bonded to the second substrate via the plurality of solder bumps. In one embodiment, the layer of resist can be deposited by dispensing liquid resist on the surface of the first substrate and spin-coating the first substrate to form the layer of resist.

Process 900 can proceed from block 902 to block 904. At block 904, a plurality of solder resist openings can be formed on the plurality of pads. The sizes of the plurality of solder resist openings can be defined by the different thicknesses of the layer of resist, and the sizes of the plurality of solder resist openings can comply with the plurality of predetermined target solder volumes. Process 900 can proceed from block 904 to block 906. At block 906, the plurality of solder resist openings can be filled with solder. Process 900 can proceed from block 906 to block 908. At block 908, the layer of resist ca be removed from the surface of the substrate. A plurality of solder bumps can be formed in response to the removing, where the plurality of solder bumps can have same solder volume as the plurality of predetermined target solder volumes.

Process 900 can proceed from block 908 to block 910. At block 910, a second substrate can be bonded to the first substrate via the plurality of solder bumps. In one embodiment, the first substrate can be a chip, the second substrate can be an interposer, and the chip can be flip-chip mounted to the interposer. In one embodiment, the first substrate can be an interposer, the second substrate can be a chip, and the chip can be flip-chip mounted to the interposer.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 10:
FIG. 10 illustrates a schematic of an example computer or processing system that may implement a system in one embodiment.

FIG. 10 illustrates a schematic of an example computer or processing system that may implement a system in one embodiment. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 6 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being run by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a module 30 that performs the methods described herein. The module 30 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:

determining, by a processor, a plurality of target solder volumes to be deposited on a plurality of pads on a surface of a substrate, wherein the plurality of target solder volumes is variable among the plurality of pads; and determining, by the processor, different thicknesses, spanning in a direction perpendicular to the surface of the substrate, of different portions of a layer of resist to be deposited across the surface of the substrate, wherein the different thicknesses define a plurality of solder resist openings having sizes that comply with the plurality of target solder volumes.

2. The method of claim 1, further comprising:

receiving, by the processor, a surface topology of the surface of the substrate, wherein the surface topology indicates depth measurements between peaks of the plurality of pads and the surface of the substrate; and based on the surface topology, generating, by the processor, pad density adjustment data indicating an adjustment to a pad density of the surface of the substrate for achieving the determined different thicknesses of the different portions of the layer of resist.

3. The method of claim 2, further comprising:

based on the surface topology, determining, by the processor, pad densities of different portions of the surface of the substrate;

identifying, by the processor, at least one portion of the surface of the substrate having a pad density that does not satisfy a threshold; and generating, by the processor, the pad density adjustment data for adjusting the pad density of the at least one portion of the surface of the substrate.

4. The method of claim 3, further comprising:

identifying, by the processor, a portion of the surface of the substrate that has a pad density lower than the threshold; and generating, by the processor, the pad density adjustment data to indicate an addition of at least one imitation pad to the at least one portion of the surface of the substrate, wherein the addition of the at least one imitation pad increases the pad density of the identified portion of the surface, and the increased pad density increases a thickness of the layer of resist at the identified portion of the surface.

5. The method of claim 3, wherein identifying the at least one portion of the surface comprises:

identifying, by the processor, a portion of the surface of the substrate that has a pad density greater than the threshold; and generating, by the processor, the pad density adjustment data to indicate a removal of at least one pad from the at least one portion of the surface of the substrate, wherein the removal of the at least one pad decreases the pad density of the identified portion of the surface, and the decreased pad density decreases a thickness of the layer of resist at the identified portion of the surface.

6. The method of claim 1, further comprising generating, by the processor, exposure adjustment data for adjusting exposure levels of a mask being used for patterning the layer of resist, wherein the adjustment to the exposure levels of the mask is for achieving the determined different thicknesses of the different portions of the layer of resist.

7. The method of claim 6, generating the exposure adjustment data comprises:

identifying, by the processor, a portion of the surface of the substrate that corresponds to a particular thickness among the different thicknesses; and generating the exposure adjustment data to adjust an exposure level of a portion of the mask that corresponds to the identified portion of the surface of the substrate, wherein the adjusted exposure level causes the layer of resist to have the particular thickness.

8. The method of claim 6, wherein the mask is a grayscale mask, and the exposure adjustment data indicates adjustment to intensity levels of the grayscale mask.

* * * * *